United States Patent
Fukuoka et al.

(10) Patent No.: US 8,379,425 B2
(45) Date of Patent: Feb. 19, 2013

(54) SEMICONDUCTOR INTEGRATED CIRCUIT DEVICE

(75) Inventors: Kazuki Fukuoka, Tokyo (JP); Yasuto Igarashi, Tokyo (JP); Ryo Mori, Tokyo (JP); Yoshihiko Yasu, Tokyo (JP); Toshio Sasaki, Mizuho (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 412 days.

(21) Appl. No.: 12/714,309

(22) Filed: Feb. 26, 2010

(65) Prior Publication Data

US 2010/0219800 A1 Sep. 2, 2010

(30) Foreign Application Priority Data

Feb. 27, 2009 (JP) ................................. 2009-045780
Oct. 13, 2009 (JP) ................................. 2009-236189

(51) Int. Cl.
*H02M 1/00* (2007.01)
*G06F 1/26* (2006.01)

(52) U.S. Cl. ...................................... 363/147; 713/300

(58) Field of Classification Search .............. 363/65–72, 363/147; 713/300
See application file for complete search history.

(56) References Cited

U.S. PATENT DOCUMENTS

| 5,739,726 | A  | * | 4/1998  | Ling ................................. 331/57 |
| 6,920,570 | B2 | * | 7/2005  | Fujimoto et al. .............. 713/300 |
| 7,085,943 | B2 | * | 8/2006  | Chun et al. ..................... 713/300 |
| 7,532,054 | B2 |   | 5/2009  | Kanno et al. |
| 7,805,620 | B2 | * | 9/2010  | Yang et al. ..................... 713/300 |
| 2002/0001213 | A1 | * | 1/2002 | Hinman et al. ............... 363/147 |

FOREIGN PATENT DOCUMENTS

| JP | 2005-079221 A | 3/2005 |
| JP | 2006-303753 A | 11/2006 |
| JP | 2007-080393 A | 3/2007 |

* cited by examiner

*Primary Examiner* — Jessica Han
(74) *Attorney, Agent, or Firm* — Miles and Stockbridge P.C.

(57) ABSTRACT

Efficient reduction in power consumption is achieved by combinational implementation of a power cutoff circuit technique using power supply switch control and a DVFS technique for low power consumption. A power supply switch section fed with power supply voltage, a circuit block in which a power cutoff is performed by the power supply switch section, and a level shifter are formed in a DEEP-NWELL region formed over a semiconductor substrate. Another power supply switch section fed with another power supply voltage, a circuit block in which a power cutoff is performed by the power supply switch section, and a level shifter are formed in another DEEP-NWELL region formed over the semiconductor substrate. In this arrangement, there arises no possibility of short-circuiting between different power supplies via each DEEP-NWELL region formed over the semiconductor substrate.

14 Claims, 25 Drawing Sheets

| | ACTIVE OPERATION MODE | | | STANDBY MODE | | |
|---|---|---|---|---|---|---|
| | OVERDRIVE | NORMAL | UNDERDRIVE | CLOCK STOP | CUTOFF 1 | CUTOFF 2 |
| VDD2(V) | 1.3 | 1.2 | 1.0 | 1.2 | 1.2 | 1.0 |
| Freq.(MHv) | 800 | 600 | 200 | Stop | Stop | Stop |
| POWER CUTOFF | NOT PERFORMED | NOT PERFORMED | NOT PERFORMED | NOT PERFORMED | PERFORMED | PERFORMED |
| POWER LEVEL | | | | | | |
| PERFORMANCE | | | | NONE | NONE | NONE |

TOPOLOGICAL ARRANGEMENT SIMILAR
TO THAT FOR STANDARD CELLS

SEMICONDUCTOR INTEGRATED CIRCUIT DEVICE

CROSS-REFERENCE TO RELATED APPLICATIONS

The disclosure of Japanese Patent Application No. 2009-45780 filed on Feb. 27, 2009 and Japanese Patent Application No. 2009-236189 filed on Oct. 13, 2009 each including the specification, drawings and abstract are incorporated herein by reference in its entirety.

BACKGROUND OF THE INVENTION

The present invention relates to techniques for enhancing characteristics of semiconductor integrated circuit devices, and more particularly to techniques for low power consumption thereon.

Recent years have seen an increasing demand for low power consumption in semiconductor integrated circuit devices, typified by system LSI devices used for mobile apparatus or the like. In the art of low power consumption, there are known a power cutoff circuit technique and a DVFS (Dynamic Voltage Frequency Scaling) technique, for example.

In the power cutoff circuit technique, a semiconductor integrated circuit device is divided into a plurality of internal circuit blocks, and an inactive circuit block is powered off to suppress a leak current that would otherwise cause a significant amount of power consumption.

In the DVFS technique, an operating frequency and voltage to be applied to a circuit block such as a processor is dynamically varied in response to requirement for current performance. In cases where a plurality of circuit blocks use different power supply voltages, it is required to provide a level shifter (level shift circuit) for varying voltage levels of signals to be sent and received between core regions.

SUMMARY OF THE INVENTION

The present inventors have studied the above-noted power cutoff circuit technique and DVFS technique regarding combinational implementation thereof for the purpose of further reducing power consumption in semiconductor integrated circuit devices.

More specifically, the present inventors examined the practicability of the following scheme in addition to low-power-consumption control by means of DVFS: In an arrangement wherein a circuit is divided into a plurality of circuit blocks, a power supply VSS having a reference potential (ground potential) or a power supply VDD having a voltage higher than the reference potential is turned off or on for each divided circuit block by using a power supply switch.

To allow each circuit block to be cut off from the power supply VSS by using the power supply switch, it is required that a PWELL region (p-type well region, p-type semiconductor region) including n-channel MOSFETs or the like formed thereon should be isolated from a p-type semiconductor substrate by a DEEP-NWELL region (deep n-type well region, deep n-type semiconductor region). If there is no DEEP-NWELL region formed between the PWELL region and the p-type semiconductor substrate, the PWELL region is in contact with the p-type semiconductor substrate. In such a formation, a short-circuit occurs between PWELL regions formed in a plurality of circuit blocks through the p-type semiconductor substrate.

A voltage of the power supply VSS is applied to each PWELL region included in each circuit block. Even if it is attempted to cut off the power supply VSS in a certain circuit block by means of power supply switch control, the voltage of the power supply VSS applied to each PWELL region in another circuit block is fed to each PWELL region in the circuit block concerned, thereby making it impossible to cut off the power supply VSS therein. To circumvent this problematic condition, it is required to form a DEEP-NWELL region as mentioned above.

The present inventors also examined the practicability of a scheme of using DVFS for a plurality of circuit blocks in combination with the above-mentioned power cutoff circuit technique in which a DEEP-NWELL region is formed. In cases where there is a difference between power supply voltages in the plural circuit blocks, it is required to interpose a level shifter between core regions. Regarding this arrangement, the present inventors found the following problem:

FIG. 26 shows an explanatory diagram of an exemplary layout of transistor formation for a level shifter, wherein a PWELL region is isolated from a p-type semiconductor substrate by a DEEP-NWELL region examined by the present inventors. FIG. 27 shows a sectional diagram of an exemplary cross-section taken along the solid line A-B-C-D in FIG. 26.

Referring to FIG. 26, there is shown a layout pattern of a transistor 100 and a transistor 101 included in a level shifter.

The transistor 100 is formed over an NWELL region 104 formed in a DEEP-NWELL region 103, and the transistor 101 is formed over an NWELL region 109 formed in the same DEEP-NWELL region 103.

That is, as illustrated, the transistor 100 and the transistor 101 are formed over the same DEEP-NWELL region 103 overlying a p-type semiconductor substrate 102.

At the location where the transistor 100 is formed, an NWELL region 104 is formed over the DEEP-NWELL region 103. In the NWELL region 104, there are disposed a p-type semiconductor region 105 serving as a drain, and a p-type semiconductor region 106 serving as a source. At the upper position of these p-type semiconductor regions 105 and 106, a gate 108 is formed via an oxide film 107.

Further, at the location where the transistor 101 is formed, an NWELL region 109 is formed over the DEEP-NWELL region 103. In the NWELL region 109, there are disposed a p-type semiconductor region 111 serving as a drain, and a p-type semiconductor region 110 serving as a source. At the upper position of these p-type semiconductor regions 110 and 111, a gate 113 is formed via an oxide film 112.

In the above-mentioned arrangement wherein the transistors 100 and 101 included in a level shifter are formed over the same DEEP-NWELL region 103, a short-circuit occurs between a sending-side power supply VDD and a receiving-side power supply VDD2 through the DEEP-NWELL region 103 as indicated in FIG. 27.

As described above, the present inventors found that, in an arrangement wherein a level shifter is required for combinational use of the DVFS technique and the power cutoff circuit technique with DEEP-NWELL region formation, there arises a problem of short-circuiting between the sending-side power supply VDD and the receiving-side power supply VDD2.

It is therefore an object of the present invention to provide a technique for achieving efficient reduction in power consumption by combinational implementation of the power cutoff circuit technique using power supply switch control and the DVFS technique for low power consumption.

The above and other objects, features and advantages of the present invention will become more apparent from the following detailed description with reference to the accompanying drawings.

The representative features of the present invention are briefed below:

In carrying out the present invention and according to one aspect thereof, there is provided a semiconductor integrated circuit device comprising a plurality of circuit blocks that are allowed to be powered off, wherein operating frequencies and power supply voltages fed to the circuit blocks can be varied dynamically, and wherein level shifters in the circuit blocks are formed in respective different WELL isolation regions over a semiconductor substrate.

Enumerated below are advantageous effects to be provided according to the representative aspects of the present invention:

(1) Low-power-consumption control can be carried out by performing a combination of a first low-power-consumption control operation and a second low-power-consumption control operation.

(2) Based on the above item (1), precise control is applicable to reduction in power consumption in a semiconductor integrated circuit device, thereby making it possible to further decrease the amount of power to be consumed.

DETAILED DESCRIPTION OF THE PREFERRED EMBODIMENTS

Figure 1:
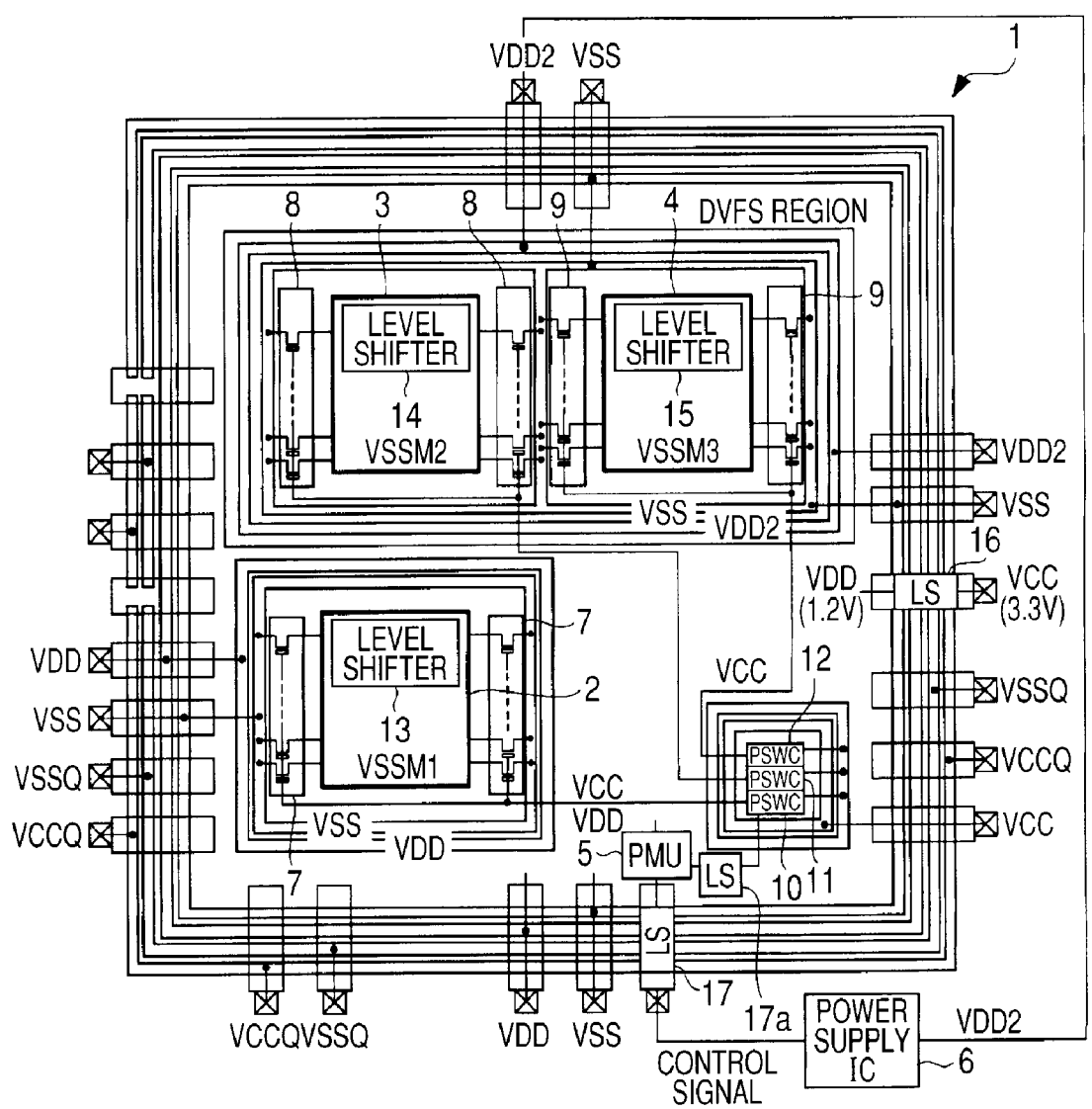
FIG. 1 is an explanatory diagram showing an exemplary configuration of a semiconductor integrated circuit device according to a preferred embodiment 1 of the present invention.

In the following detailed description of the preferred embodiments according to the present invention, some aspects of the present invention are separately described in a plurality of sections or in a plurality of forms corresponding to individual preferred embodiments for the sake of convenience in explanation as required. It is to be noted, however, that these sections and forms are mutually related unless otherwise specified, i.e., each section or form pertaining to a certain aspect separately described hereinbelow is in whole or in part associated with the other sections or forms concerned in such a fashion as a modified embodiment, additional arrangement, or supplementary implementation. Further, where specific numeric values regarding component elements (quantities, ranges, and other values) are indicated in the following description of the preferred embodiments, it is to be understood that the present invention is not limited to the indicated specific values, and that larger or smaller values than the indicated specific values may be applied unless otherwise specified or unless preconditioned basically on the principle of operation. Furthermore, in the description of the preferred embodiments, it will be obvious to those skilled in the art that some component elements thereof (including some elementary steps thereof or the like) are not necessarily required unless otherwise specified or unless definitely required on the principle of operation. Likewise, where conditions such as configurations, positions, and relationships of component elements or the like are described regarding the preferred embodiments, it is to be understood that conditions analogous thereto such as substantially approximate or similar configurations, positions, and relationships are also included therein. The same shall also apply to numeric values (quantities, ranges, and other values) in the description of the preferred embodiments.

The present invention will now be described in detail by way of example with reference to the accompanying drawings showing the preferred embodiments thereof. Throughout the accompanying drawings, like reference characters designate like or corresponding parts to avoid repetitive description thereof. In the following description of the preferred embodiment, no duplicative explanation is given regarding identical or similar parts unless otherwise necessary.

Preferred Embodiment 1

Figures 2A, 2B:
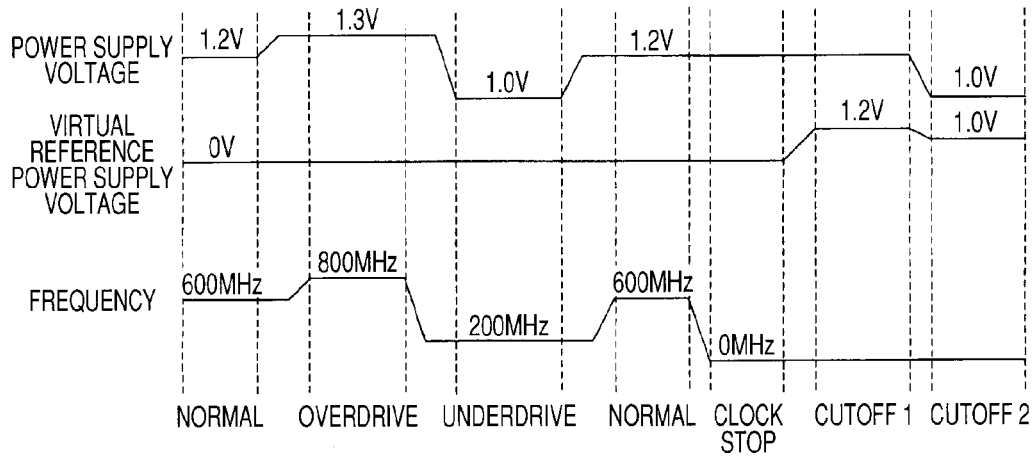
FIGS. 2(a) and 2(b) are explanatory diagrams showing exemplary operation modes provided by means of DVFS and power cutoff in the semiconductor integrated circuit device illustrated in FIG. 1.
Figure 3:
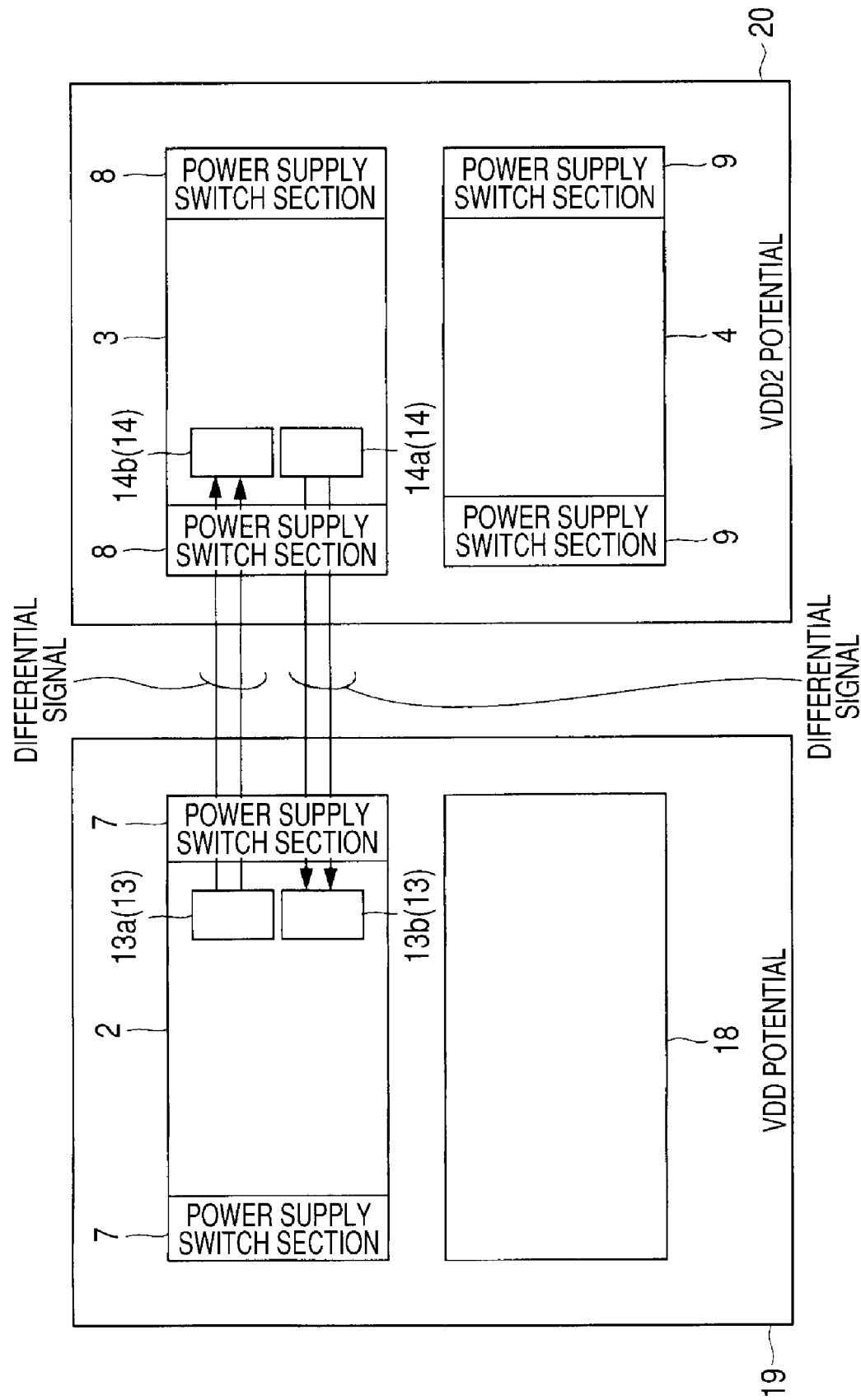
FIG. 3 is an explanatory diagram showing an exemplary configurational layout of level shifters disposed in circuit blocks of the semiconductor integrated circuit device illustrated in FIG. 1.
Figure 4:
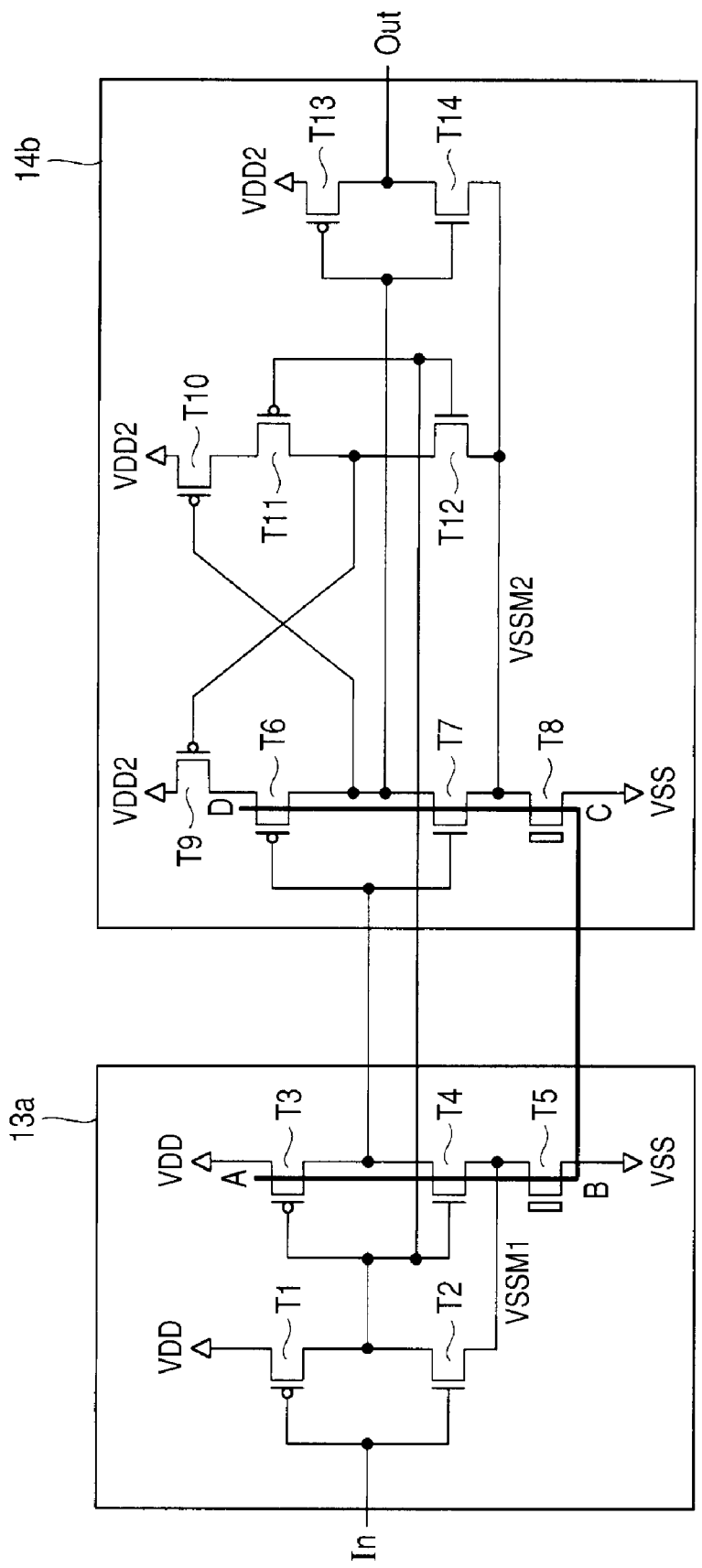
FIG. 4 is a circuit diagram showing an exemplary circuit arrangement of a sending-side level shift section and a receiving-side level shift section in the semiconductor integrated circuit device illustrated in FIG. 1.
Figure 5:
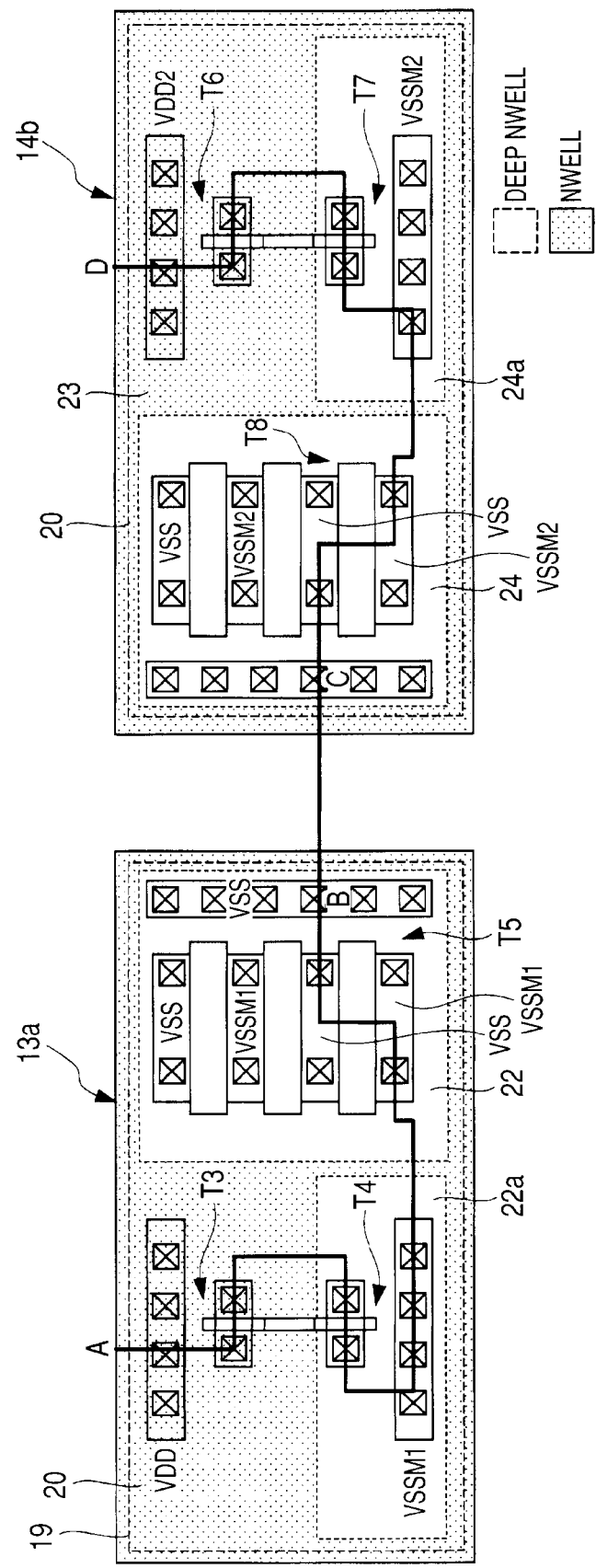
FIG. 5 is a plan view showing an exemplary layout of device elements indicated by the solid line A-B-C-D in FIG. 4.
Figure 6:
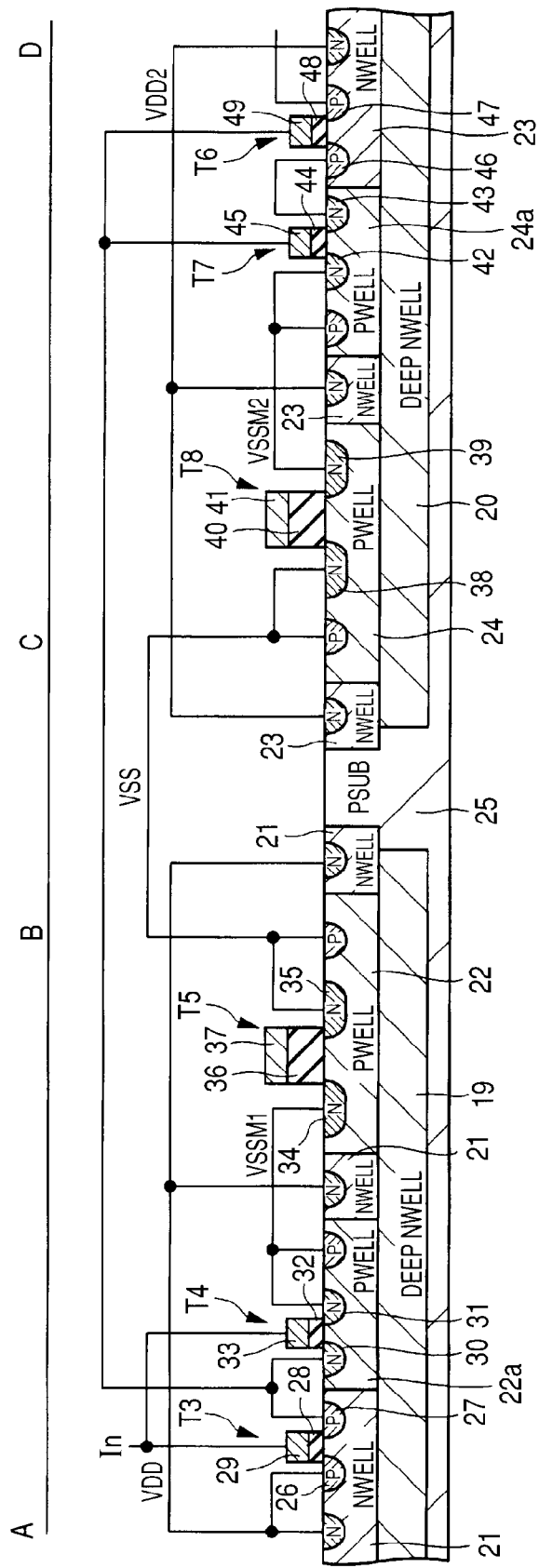
FIG. 6 is a sectional diagram showing an exemplary cross-section taken along the solid line A-B-C-D in FIG. 5.
Figure 7:
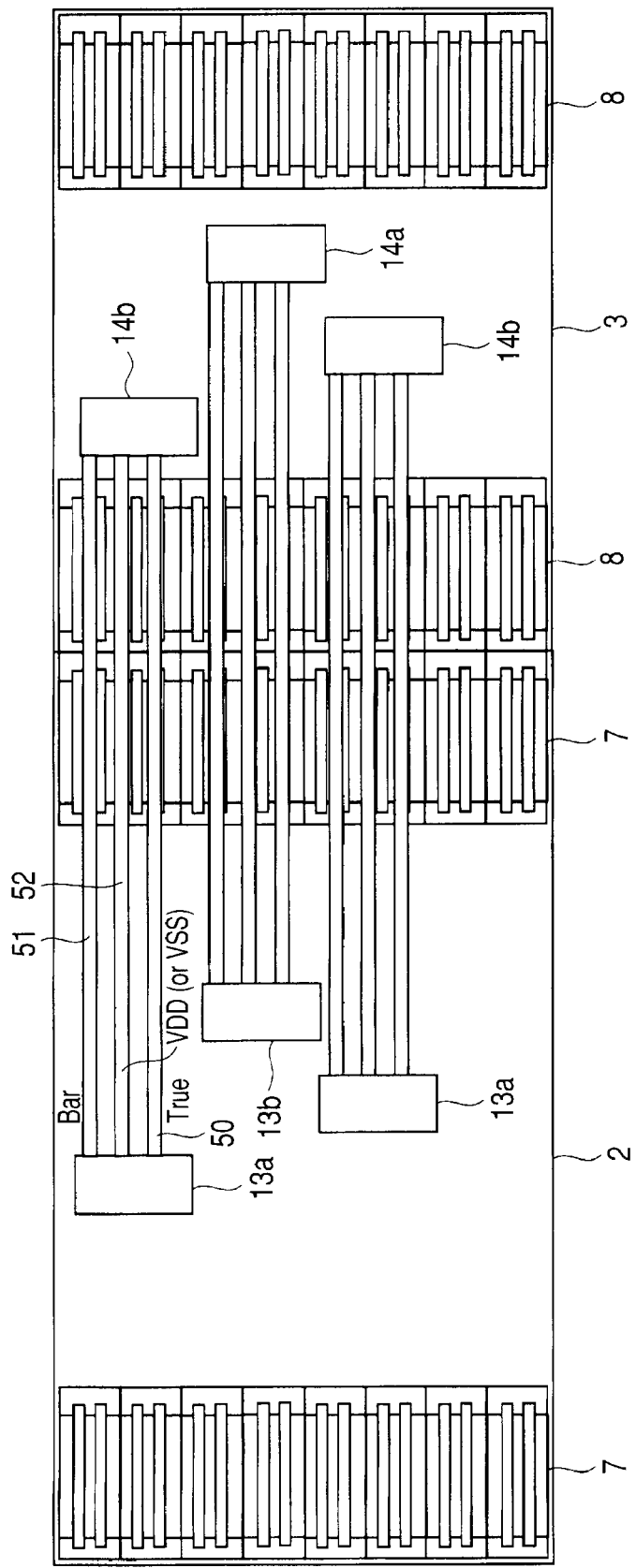
FIG. 7 is an explanatory diagram showing an exemplary wiring arrangement of the sending-side level shift section and the receiving-side level shift section in FIG. 4.
Figure 8:
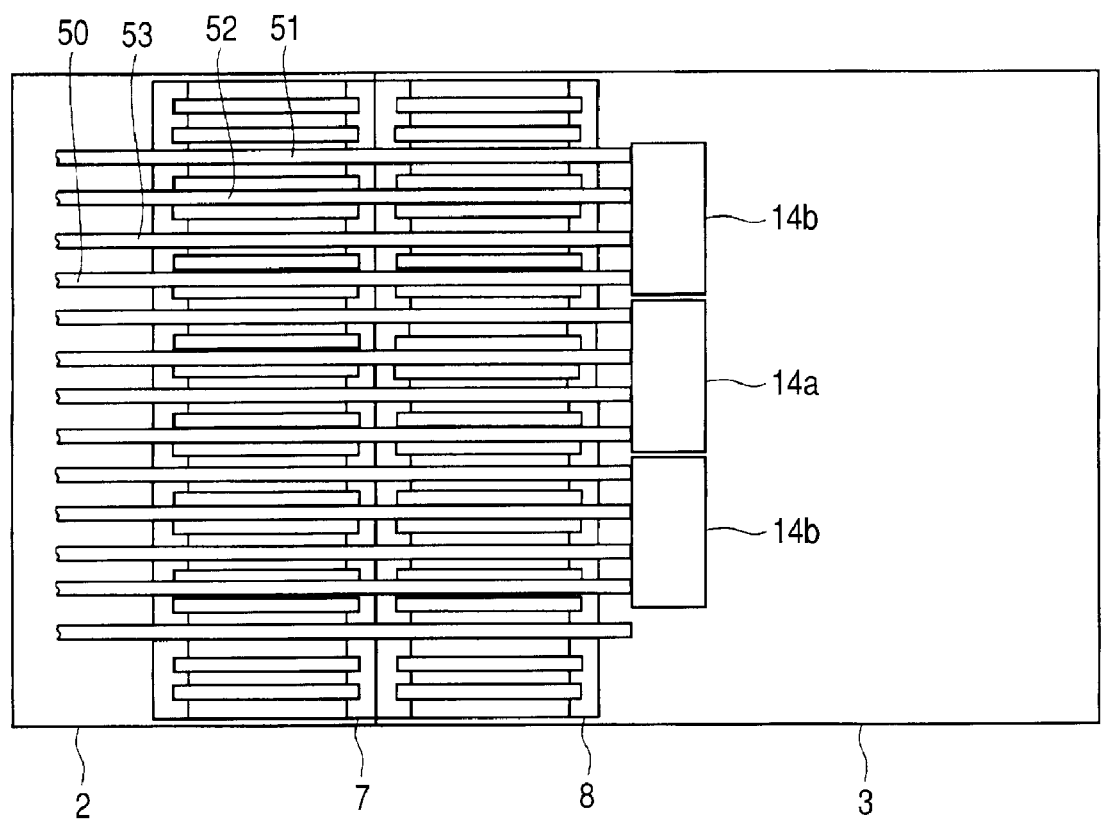
FIG. 8 is an explanatory diagram showing another exemplary wiring arrangement of the sending-side level shift section and the receiving-side level shift section in FIG. 4.

FIG. 1 shows an explanatory diagram of an exemplary configuration of a semiconductor integrated circuit device according to a preferred embodiment 1 of the present invention; FIGS. 2(*a*) and 2(*b*) show explanatory diagrams of exemplary operation modes arranged by means of DVFS and power cutoff in the semiconductor integrated circuit device in FIG. 1; FIG. 3 shows an explanatory diagram of an exemplary configurational layout of level shifters disposed in circuit blocks of the semiconductor integrated circuit device in FIG. 1; FIG. 4 shows a circuit diagram of an exemplary circuit arrangement of a sending-side level shift section and a receiving-side level shift section in the semiconductor integrated circuit device in FIG. 1; FIG. 5 shows a plan view of an exemplary layout of device elements indicated by the solid line A-B-C-D in FIG. 4; FIG. 6 shows a sectional diagram of an exemplary cross-section taken along the solid line A-B-C-D in FIG. 5; FIG. 7 shows an exemplary diagram of an exemplary wiring arrangement of the sending-side level shift section and the receiving-side level shift section in FIG. 4; and FIG. 8 shows an explanatory diagram of another exemplary wiring arrangement of the sending-side level shift section and the receiving-side level shift section in FIG. 4.

According to the preferred embodiment 1 of the present invention, a semiconductor integrated circuit device 1 comprises a plurality of circuit blocks 2 to 4 as shown in FIG. 1. The circuit block 2 (a first circuit block) is arranged as a region fed with a voltage of a power supply VDD.

The circuit block 3, 4 (a second circuit block) is arranged as a region fed with a voltage of a power supply VDD2 having a voltage level that can be dynamically varied by means of DVFS (a second low-power-consumption control operation).

The power supply VDD2, which is of a variable voltage type, is controlled by a Power Management Unit (PMU) 5 disposed in a circuit block 18 shown in FIG. 3. The circuit block 18 is fed with power supply voltage VDD, and no power supply switch section is provided therein. The circuit block 18 is a so-called "always-on region" wherein a power cutoff is not performed.

The PMU 5, which serves as a power supply switch control section and a frequency/power supply control section, issues a voltage regulation instruction (control signal) to a power supply IC 6 coupled to the semiconductor integrated circuit device 1 for frequency/power supply control. In accordance with the voltage regulation instruction, the power supply IC 6 generates an arbitrary level of power supply voltage VDD2. It is to be noted that the power supply IC 6 is not limited to an external IC coupled to the semiconductor integrated circuit device 1 as exemplified in FIG. 1, and that the power supply IC 6 may be included in the semiconductor integrated circuit device 1.

The circuit blocks 2, 3, and 4 are coupled respectively with a power supply switch section 7 (a first power supply switch section), a power supply switch section 8 (a second power supply switch section), and a power supply switch section 9 (a second power supply switch section), each comprising n-channel MOS transistors coupled in parallel. In these power supply switch sections, a gate insulating film of each n-channel MOS transistor thereof is formed to have a thickness larger than that of a gate insulating film of MOS transistors used in the other regions for the purpose of enhancing dielectric strength in gate insulation.

The power supply switch section 7 is coupled between the circuit block 2 and a power supply VSS so as to provide a coupling node serving as a virtual power supply VSSM1. The power supply switch section 8 is coupled between the circuit block 3 and the power supply VSS so as to provide a coupling node serving as a virtual power supply VSSM2.

Further, the power supply switch section 9 is coupled between the circuit block 4 and the power supply VSS so as to provide a coupling node serving as a virtual power supply VSSM3 (refer to FIG. 4 for which description will be given later).

The power supply switch sections 7 to 9 are coupled to power supply controllers 10 to 12 (PSWC; power supply switch control sections), respectively. Under the direction of the power supply switch controllers 10 to 12, the power supply switch sections 7 to 9 are turned on/off, respectively. Thus, each of the circuit blocks 2 to 4 is powered off independently (a first low-power-consumption control operation; a first power control state).

Upon receiving an instruction output from the PMU 5, the power supply switch controllers 10 to 12 deliver control signals to the power supply switch sections 7 to 9 for control thereof, respectively. In the power supply switch sections 7 to 9, a gate insulating film of each transistor thereof may be formed to have a thickness equal to that of a gate insulating film of n-channel MOS transistors used in a core region. In this case, it is to be noted that the power supply VDD is used for the power supply switch controllers 10 to 12.

Further, in the circuit blocks 2 to 4, there are provided level shifters 13 to 15, respectively. These level shifters 13 to 15 are used for converting signal voltage levels at the time of signal transmission/reception between the circuit block 2 and the circuit block 3 or between the circuit block 2 and the circuit block 4.

Still further, the semiconductor integrated circuit device 1 includes a level shifter 16 disposed for each input/output terminal. The level shifter 16 performs a voltage level conversion operation on input/output signals (conversion from an amplitude level of power supply voltage VCC into an amplitude level of power supply voltage VDD) for each input/output section coupled to an external circuit. Each input/output section is driven by a power supply VCCQ and power supply VSSQ that have voltages thereof fed from external circuits.

Furthermore, the semiconductor integrated circuit device 1 includes a level shifter 17 for converting a signal voltage level of each control signal to be output from the PMU 5 to the power supply IC 6, and a level shifter 17a for converting a voltage level of each instruction to be output from the PMU 5 to the power supply switch controllers 10 to 12.

FIGS. 2(*a*) and 2(*b*) show explanatory diagrams of exemplary operation modes provided by means of DVFS and power cutoff thorough use of the power supply switch sections 7 to 9.

As shown in FIG. 2(*a*), the semiconductor integrated circuit device 1 is provided with active operation modes and standby modes. The active operation modes includes an "overdrive" mode, a "normal" mode, and an "underdrive" mode; and the standby modes includes a "clock stop" mode, a "cutoff 1" mode, and a "cutoff 2" mode.

In FIG. 2(*b*), there is shown a graph indicating voltage levels of the power supply VDD2, voltage levels of the virtual reference power supply VSSM, and operating frequencies of clock signaling in respective modes mentioned above.

First, the active operation modes are described below: In the "overdrive" mode included therein, the voltage level of the power supply VDD2 is increased from approximately 1.2 V assigned as a normal voltage value to approximately 1.3 V, and the operating frequency of clock signaling is also increased to approximately 800 MHz, for example. Both the level of power consumed and the operating frequency of clock signaling are maximized in the "overdrive" mode.

Further, in the "normal" mode, the voltage level of the power supply VDD2 is approximately 1.2 V, and the operating frequency of clock signaling is approximately 600 MHz, for example.

Still further, in the "underdrive" mode, the voltage level of the power supply VDD2 is decreased to approximately 1.0 V, and the operating frequency of clock signaling is also decreased to approximately 200 MHz, for example. Both the level of power consumed and the operating frequency of clock signaling are minimized in the "underdrive" mode in comparison of the three active operation modes.

As described above, the operating frequency of clock signaling and the voltage level of the power supply VDD2 are increased in a situation where higher-frequency operation is required. Alternatively, the operating frequency of clock signaling and the voltage level of the power supply VDD2 are decreased in a situation where lower-frequency operation is performed.

Thus, power consumption in active operation can be reduced efficiently.

The standby modes are then described below: In the "clock stop" mode included therein, a clock signal is stopped, and a power supply voltage VDD2 of approximately 1.2 V is applied, for example. The "clock stop" mode does not allow a power cutoff to be made by the power supply switch sections 8 and 9.

Further, in the "cutoff 1" mode, the clock signal is also stopped, and a power supply voltage VDD2 of approximately 1.2 V is applied, for example. A power cutoff is made by the power supply switch sections 8 and 9 in the "cutoff 1" mode.

Still further, in the "cutoff 2" mode, the clock signal is also stopped, and the voltage level of the power supply VDD2 is decreased to approximately 1.0 V, for example. A power cutoff is made by the power supply switch sections 8 and 9 in the "cutoff 2" mode.

In cases where the clock signal is just stopped under standby condition, there remains a disadvantage of current leakage. With respect to the "clock stop" mode in which the clock signal is just stopped, it is possible to further reduce standby current requirement by performing a power cutoff using the power supply switch sections 8 and 9 under the standby condition. In this case, a decrease in power supply voltage brings about even further reduction in standby current. Therefore, in the "cutoff 2" mode, the voltage level of the power supply VDD2 is decreased further, contributing to a more advantageous effect on reduction in current leakage.

FIG. 3 shows an explanatory diagram of an exemplary configurational layout of the level shifter 13 disposed in the circuit block 2 and the level shifter 14 disposed in the circuit block 3.

The level shifter 13 disposed in the circuit block 2 comprises a sending-side level shift section 13a (a first sending-side level shifter) and a receiving-side level shift section 13b (a second receiving-side level shifter). Likewise, the level shifter 14 disposed in the circuit block 3 comprises a sending-side level shift section 14a (a second sending-side level shifter) and a receiving-side level shift section 14b (a first receiving-side level shifter).

Through the sending-side level shift section 13a, a signal output from the circuit block 2 is converted into a differential signal, which is then output to the receiving-side level shift section 14b. Through the sending-side level shift section 14a, a signal output from the circuit block 3 is converted into a differential signal, which is then output to the receiving-side level shift section 13b.

Upon receipt of the differential signal, the receiving-side level shift section 13b converts the received differential signal into an amplitude level of power supply voltage VDD. On the other hand, upon receipt the differential signal, the receiving-side level shift section 14b converts the received differential signal into an amplitude level of power supply voltage VDD2. Although not shown in FIG. 3, the circuit block 4 also includes a sending-side level shift section and a receiving-side level shift section arranged in a fashion similar to that described above.

As shown in FIG. 3, the circuit block 2, and the circuit block 18, which is used as an always-on region constantly fed with power supply voltage VDD, are formed over a DEEP-NWELL region 19 serving as a WELL isolation region. The circuit blocks 3 and 4 are formed over a DEEP-NWELL region 20 fed with power supply voltage VDD2. These DEEP-NWELL regions 19 and 20 are disposed isolatedly in a mutually independent fashion.

FIG. 4 shows a circuit diagram of an exemplary circuit arrangement of the sending-side level shift section 13a and the receiving-side level shift section 14b. Each level shifter is arranged as a circuit for converting two different kinds of power supply voltages. The power supply VDD is used for the sending-side level shifter. The power supply VDD2 is used for the receiving-side level shifter and a succeeding-stage output buffering section thereof. The circuit having a configuration mentioned above is provided as a cell.

The sending-side level shift section 13a comprises transistors T1 to T4, and the receiving-side level shift section 14b comprises transistors T6, T7, and T9 to T14. A transistor T5 is an element included in the power supply switch section 7, and a transistor T8 is an element included in the power supply switch section 8.

The transistors T1 and T3 are formed as p-channel MOS elements, and the transistors T2, T4, and T5 are formed as n-channel MOS elements. Further, the transistors T6, T9, T10, T11, and T13 are formed as p-channel MOS elements, and the transistors T7, T8, T12, and T14 are formed as n-channel MOS elements.

The transistors T1 and T2 are arranged to configure an inverter coupled in series between the power supply VDD and the virtual power supply VSSM1. A signal output from the circuit block 2 is input to an input part of the inverter configured by the transistors T1 and T2.

The transistors T3 and T4 are also arranged to configure an inverter coupled in series between the power supply VDD and the virtual power supply VSSM1. An output part of the inverter configured by the transistors T1 and T2 is coupled to an input part of the inverter configured by the transistors T3 and T4.

One power electrode part (drain) of the transistor T5 is coupled to the virtual power supply VSSM1, and the other power electrode part (source) of the transistor T5 is coupled to the power supply VSS.

One power electrode part (source) of each of the transistors T9 and T10 is coupled to the power supply VDD2, and between the other power electrode part (drain) of the transistor T9 and the virtual power supply VSSM2, the transistors T6 and T7 are coupled in series to configure an inverter.

Likewise, between the other power electrode part (drain) of the transistor T10 and the virtual power supply VSSM2, the transistors T11 and T12 are coupled in series to configure an inverter. One power electrode part (drain) of the transistor T8 is coupled to the virtual power supply VSSM2, and the other power electrode part (source) of the transistor T8 is coupled to the power supply VSS.

Further, the transistors T13 and T14 are arranged to configure an inverter coupled in series between the power supply VDD2 and the virtual power supply VSSM2.

The transistor T10 has a gate thereof coupled to an output part of the inverter configured by the transistors T6 and T7, and the transistor T9 has a gate thereof coupled to an output part of the inverter configured by the transistors T11 and T12.

A signal output from the inverter configured by the transistors T3 and T4 is applied as a differential signal to an input part of the inverter configured by the transistors T6 and T7. Likewise, a signal output from the inverter configured by the transistors T1 and T2 is applied as a differential signal to an input part of the inverter configured by the transistors T11 and T12.

Further, an output part of the inverter configured by the transistors T6 and T7 is coupled to an input part of the inverter configured by the transistors T13 and T14, and an output part of the inverter configured by the transistors T13 and T14 is arranged to serve as an output part of the receiving-side level shift section 14b.

FIG. 5 shows a plan view of an exemplary layout of device elements indicated by the solid line A-B-C-D in FIG. 4.

In the sending-side level shift section 13a shown on the left of FIG. 5, the transistor T3 is disposed at the upper left position thereof, and the transistor T4 is disposed at the lower left position thereof.

The transistor T5 included in the power supply switch section 7 is disposed at the right position of the transistor T4.

In the receiving-side level shift section 14b shown on the right of FIG. 5, the transistor T8 included in the power supply switch section 8 is disposed at the lower left position thereof. The transistor T7 is disposed at the right position of the transistor T8, and the transistor T6 is disposed at the upper position of the transistor T7.

The transistor T3, shown in FIG. 5, is formed in an NWELL region 21 overlying the DEEP-NWELL region 19. The transistors T4 and T5 are formed in a PWELL region 22a and a PWELL region 22 overlying the DEEP-NWELL region 19, respectively.

The transistor T6 is formed in an NWELL region 23 overlying the DEEP-NWELL region 20 that is disposed isolatedly from the DEEP-NWELL region 19. The transistors T7 and T8 are formed in a PWELL region 24a and a PWELL region 24 overlying the DEEP-NWELL region 20, respectively.

FIG. 6 shows a sectional diagram of an exemplary cross-section taken along the solid line A-B-C-D in FIG. 5.

As shown at the left and right positions in FIG. 6, the DEEP-NWELL region 19 and the DEEP-NWELL region 20 are isolatedly formed respectively in a mutually independent fashion over a p-type semiconductor substrate 25. Over the DEEP-NWELL region 19, the NWELL region 21 is disposed between the PWELL region 22a (left side) and the PWELL region 22 (right side).

In the NWELL region 21, a p-type semiconductor region 26 and a p-type semiconductor region 27 are formed to serve as a source and drain of the transistor T3, respectively. Over the p-type semiconductor regions 26 and 27, a gate 29 is formed via an oxide film 28.

In the PWELL region 22a, an n-type semiconductor region 30 and an n-type semiconductor region 31 are formed to serve as a drain and source of the transistor T4, respectively. Over the n-type semiconductor regions 30 and 31, a gate 33 is formed via an oxide film 32.

In the PWELL region 22, an n-type semiconductor region 34 and an n-type semiconductor region 35 are formed to serve as a source and drain of the transistor T5, respectively. Over the n-type semiconductor regions 34 and 35, a gate 37 is formed via an oxide film 36.

In the PWELL region 24, an n-type semiconductor region 38 and an n-type semiconductor region 39 are formed to serve as a source and drain of the transistor T8, respectively. Over the n-type semiconductor regions 38 and 39, a gate 41 is formed via an oxide film 40.

In the PWELL region 24a, an n-type semiconductor region 42 and an n-type semiconductor region 43 are formed to serve as a source and drain of the transistor T7, respectively. Over the n-type semiconductor regions 42 and 43, a gate 45 is formed via an oxide film 44.

In the NWELL region 23, a p-type semiconductor region 47 and a p-type semiconductor region 46 are formed to serve as a source and drain of the transistor T6, respectively. Over the p-type semiconductor regions 46 and 47, a gate 49 is formed via an oxide film 48.

As mentioned above, since the DEEP-NWELL region 19 and the DEEP-NWELL region 20 are formed isolatedly in a mutually independent fashion, a short-circuit between the power supply VDD and the power supply VDD2 that have different voltage levels can be prevented owing to isolation between the DEEP-NWELL regions 19 and 20.

Further, over each DEEP-NWELL region, the sending-side level shift section and the receiving-side level shift section each have only one power supply. It is therefore possible to make a topological arrangement similar to that for other standard cells. Thus, there can be provided a higher degree of freedom in layout design and an affinity for standard cells.

FIG. 7 shows an exemplary wiring arrangement of the sending-side level shift section 13a and the receiving-side level shift section 14b (or the receiving-side level shift section 13b and the sending-side level shift section 14b).

As shown in FIG. 7, the sending-side level shift section 13a and the receiving-side level shift section 14b are provided with a wiring arrangement therebetween comprising a True wiring line 50 and a Bar wiring line 51 for feeding differential signals, and a power wiring line 52 for feeding power supply voltage VDD (or power supply voltage VSS).

In the wiring arrangement mentioned above, the True wiring line 50 and the Bar wiring line 51 are formed to have a length substantially equal to each other. (It is preferable that the lengths of the True wiring line 50 and the Bar wiring line 51 should be substantially equal to each other within a range of allowing a delay to an extent that a through-current value has no adverse effect on operations of the semiconductor integrated circuit device 1.)

Thus, a delay time in differential signal propagation can be reduced significantly, and a through-current in the receiving-side level shift section 14b can also be reduced.

Further, the power wiring line 52 is so disposed as to provide shielding between the True wiring line 50 and the Bar wiring line 51, thereby making it possible to reduce crosstalk noise due to possible cross-coupling between the wiring line 50 and the Bar wiring line 51.

FIG. 8 shows an explanatory diagram of another exemplary wiring arrangement of the sending-side level shift section 14a and the receiving-side level shift section 14b.

While the power wiring line 52 for feeding power supply voltage VDD (or power supply voltage VSS) is disposed sandwich-wise between the True wiring line 50 and the Bar wiring line 51 in the exemplary wiring arrangement shown in FIG. 7, the two power wiring lines may be disposed sandwich-wise between the True wiring line 50 and the Bar wiring line 51, i.e., the power wiring line 52 for feeding power supply voltage VDD and a power wiring line 53 for feeding power supply voltage VSS may be disposed sandwich-wise between the True wiring line 50 and the Bar wiring line 51 as shown in FIG. 8.

Figure 27:
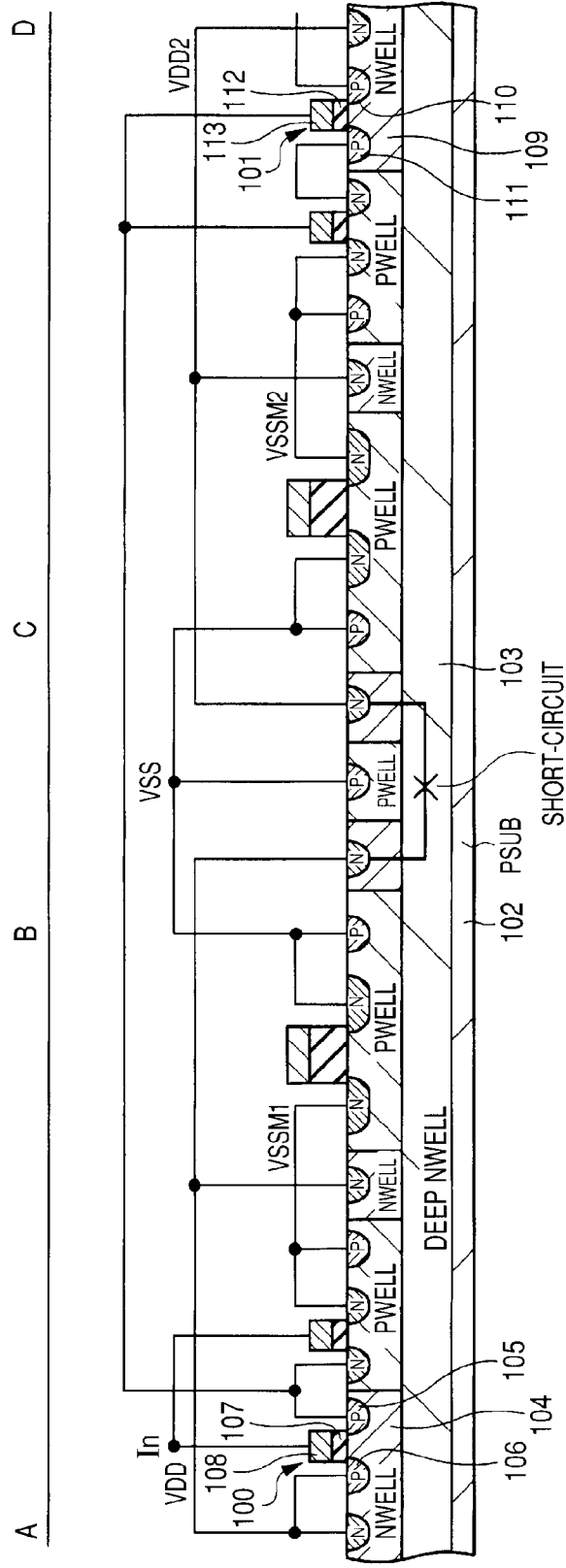
FIG. 27 is a sectional diagram showing an exemplary cross-section taken along the solid line A-B-C-D in FIG. 26.

According to the preferred embodiment 1 of the present invention, there is provided a principal feature that the DEEP-NWELL region 19 and the DEEP-NWELL region 20 are formed isolatedly in a mutually independent fashion and that the sending-side level shift section 13a and the receiving-side level shift section 14b are disposed in the DEEP-NWELL region 19 and the DEEP-NWELL region 20, respectively, as shown in FIGS. 5 and 6. As described in the foregoing, in the configuration shown in FIG. 27 examined by the present inventors, there arises a problem of possible short-circuiting between the power supply VDD and the power supply VDD2 through the DEEP-NWELL region 103. Contrastingly, in the preferred embodiment 1 of the present invention, the DEEP-NWELL region 19 and the DEEP-NWELL region 20 are formed isolatedly in a mutually independent fashion to prevent short-circuiting between the power supply VDD and the power supply VDD2.

In cases where a plurality of DEEP-NWELL regions are disposed isolatedly, it is required to provide a space between the DEEP-NWELL regions. That is, in comparison with the formation of a single DEEP-NWELL region, a larger plane area is required to cause an increase in chip plane size. Hence, for common applications, the formation of a plurality of isolated DEEP-NWELL regions is regarded as disadvantageous. Nonetheless, since the present inventors have found a problem of possible short-circuiting between the power supply VDD and the power supply VDD2, the DEEP-NWELL region 19 and the DEEP-NWELL region 20 are formed isolatedly in a mutually independent fashion for the purpose of solving this problem. Thus, it has become possible to inventively implement a combination of power cutoff and DVFS techniques.

Preferred Embodiment 2

Figure 9:
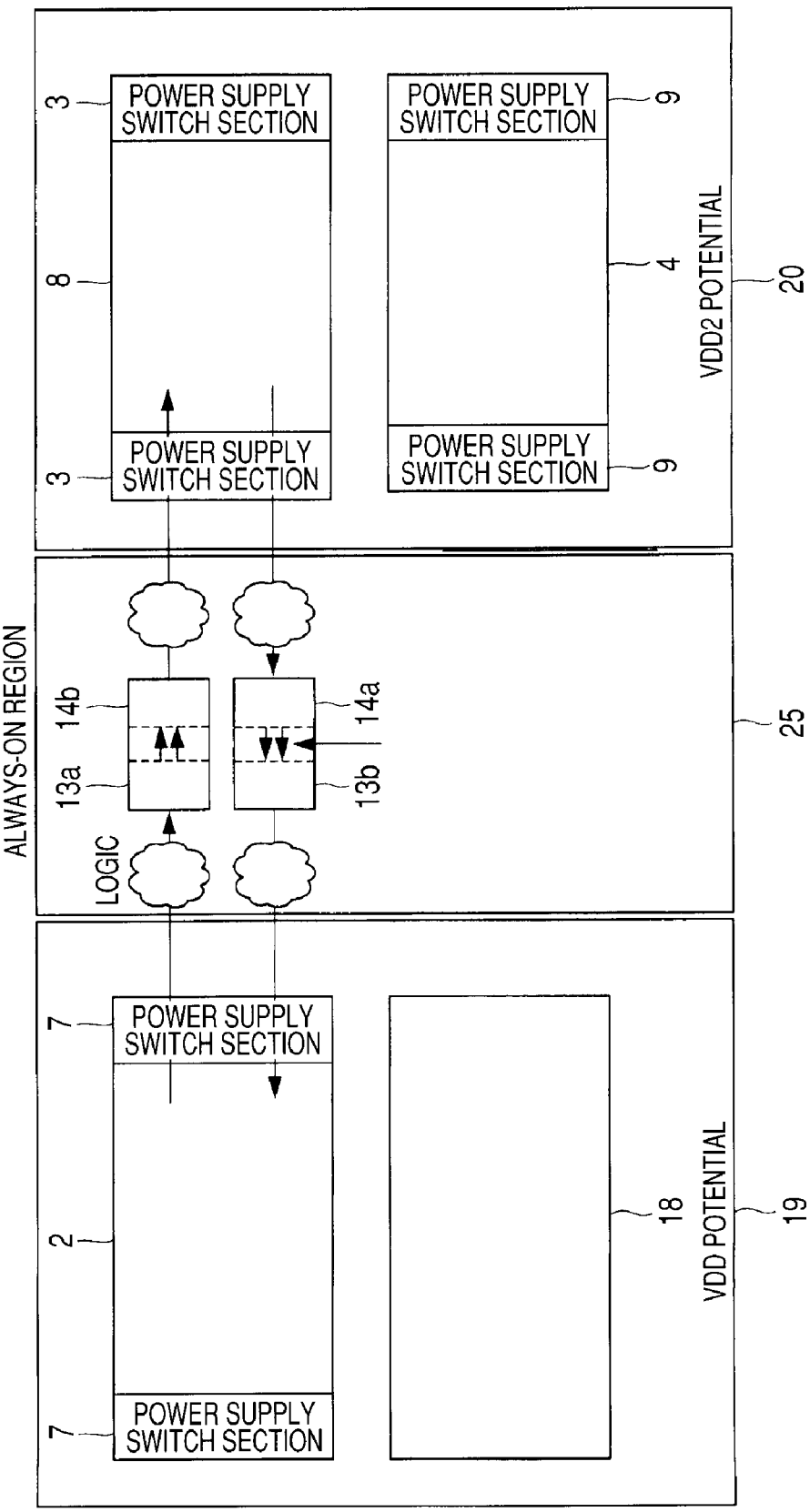
FIG. 9 is an explanatory diagram showing an exemplary configurational layout of level shifters disposed in circuit blocks according to a preferred embodiment 2 of the present invention.
Figure 10:
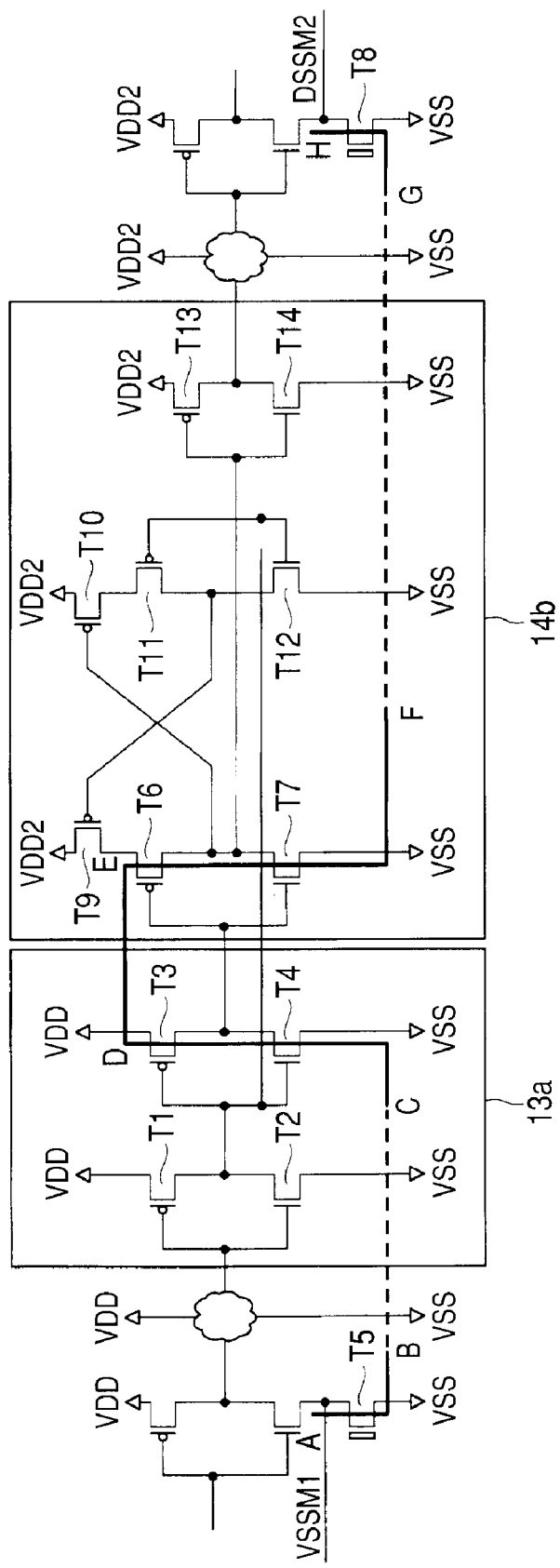
FIG. 10 is a circuit diagram showing an exemplary circuit arrangement of a sending-side level shift section and a receiving-side level shift section included in each of the level shifters in FIG. 9.
Figure 11:
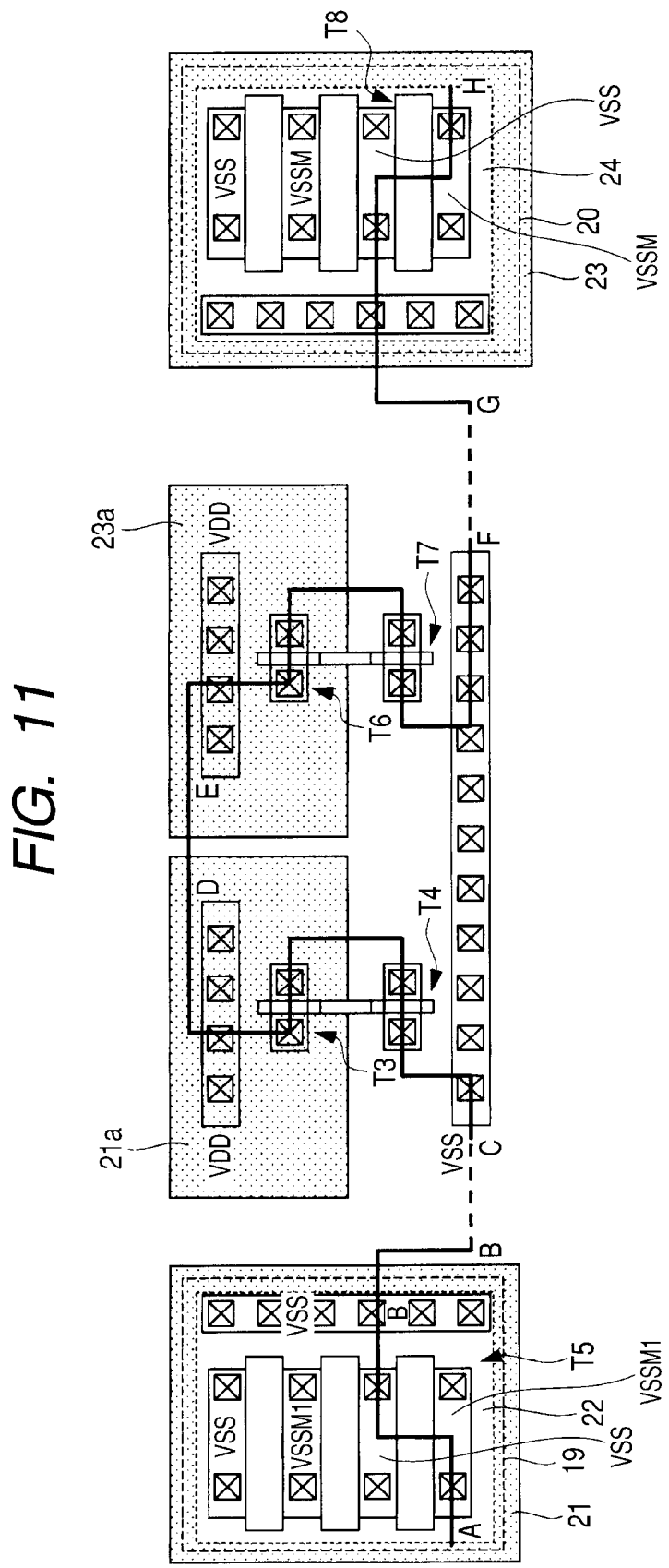
FIG. 11 is a plan view showing an exemplary layout of device elements indicated by the solid lines A-B, C-D-E-F, and G-H in FIG. 10.
Figure 12:
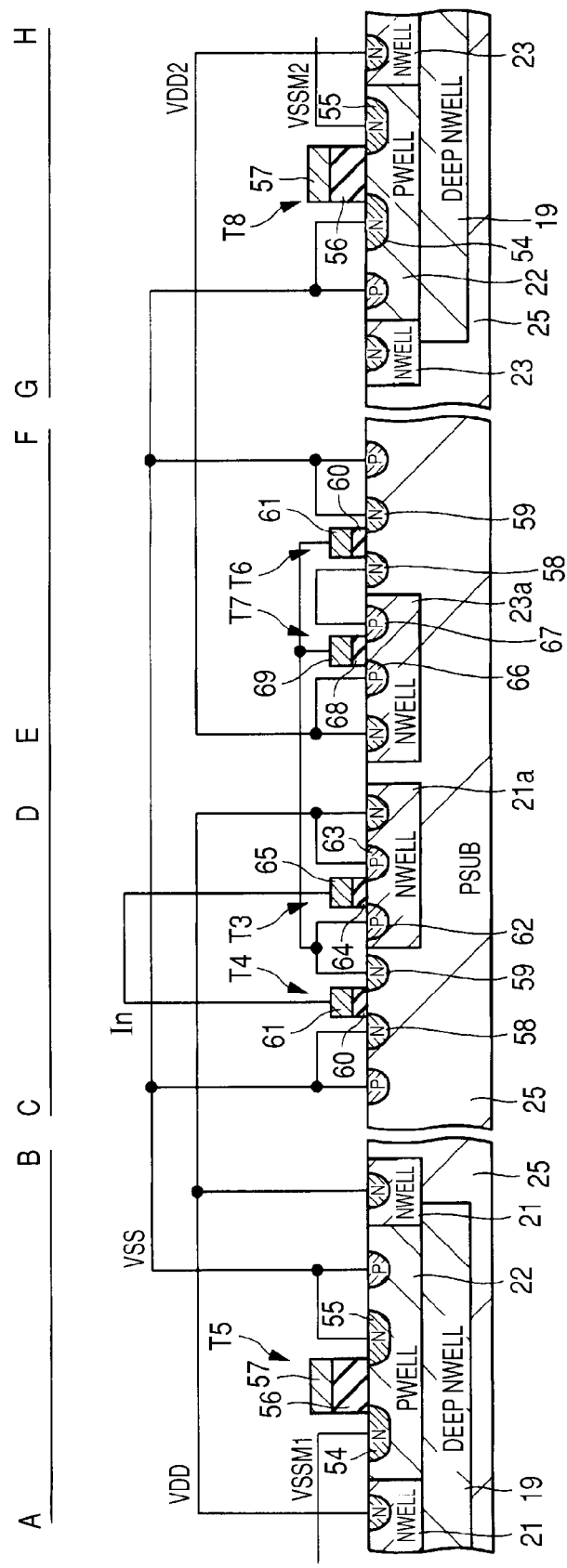
FIG. 12 is a sectional diagram showing an exemplary cross-section taken along the solid lines A-B, C-D-E-F, and G-H in FIG. 10.

FIG. 9 shows an explanatory diagram of an exemplary configurational layout of level shifters disposed in circuit blocks according to a preferred embodiment 2 of the present invention; FIG. 10 shows a circuit diagram of an exemplary circuit arrangement of a sending-side level shift section and a receiving-side level shift section included in each of the level shifters in FIG. 9; FIG. 11 shows a plan view of an exemplary layout of device elements indicted by the solid lines A-B, C-D-E-F, and G-H in FIG. 10; and FIG. 12 shows a sectional diagram of an exemplary cross-section taken along the solid lines A-B, C-D-E-F, and G-H in FIG. 10.

According to the preferred embodiment 2 of the present invention, the sending-side level shift section 13a and the receiving-side level shift section 14b are formed in an always-on region of the p-type semiconductor substrate 25 between the DEEP-NWELL region 19 and the DEEP-NWELL region 20 as shown in FIG. 9.

While FIG. 9 shows an example in which the circuit block 18 used as an always-on region is formed in the DEEP-NWELL region 19, there may be provided a modified arrangement wherein the circuit block 18 is formed in a region other than the DEEP-NWELL region 19.

Referring to FIG. 10, there is shown an exemplary circuit configuration of the sending-side level shift section 13a and the receiving-side level shift section 14b.

The sending-side level shift section 13a comprises transistors T1 to T4 as in the preferred embodiment 1 shown in FIG. 4. Likewise, the receiving-side level shift section 14b comprises transistors T6, T7, and T9 to T14 as in the preferred embodiment 1 shown in FIG. 4.

In the sending-side level shift section 13a, being different from the preferred embodiment 1 shown in FIG. 4, the transistor T5 is coupled between the virtual power supply VSSM1 and the power supply VSS in the circuit block 2, and the other power electrode part of each of the transistors T2 and T4 is coupled to the power supply VSS.

Similarly, in the receiving-side level shift section 14b, being different from the preferred embodiment 1 shown in FIG. 4, the transistor T8 is coupled between the virtual power supply VSSM2 and the power supply VSS in the circuit block 3, and the other power electrode part of each of the transistors T7, T12, and T14 is coupled to the power supply VSS. Since the other coupling arrangements are similar to those shown in FIG. 4, no repetitive description thereof is given here.

FIG. 11 shows a plan view of an exemplary layout of device elements indicated by the solid lines A-B, C-D-E-F, and G-H in FIG. 10.

As shown on the left of the FIG. 11, the transistor T5 is formed in the PWELL region 22 overlying the DEEP-NWELL region 19. The PWELL region 22 is so formed as to be surrounded by the NWELL region 21.

At the right position of the transistor T5, the transistor T4 is formed over the p-type semiconductor substrate 25 (FIG. 12), and at the upper position of the transistor T4, the transistor T3 is formed over the NWELL region 21a.

At the right position of the transistor T3, the transistor T6 is formed over the NWELL region 23a, and at the lower position of the transistor T6, the transistor T7 is formed over the p-type semiconductor substrate 25.

Further, the transistor T8 is formed in the PWELL region 24 overlying the DEEP-NWELL region 20. The PWELL region 24 is so formed as to be surrounded by the NWELL region 23.

FIG. 12 shows a sectional diagram of an exemplary cross-section taken along the solid lines A-B, C-D-E-F, and G-H in FIG. 10.

For the transistor T5, the DEEP-NWELL region 19 is formed over the p-type semiconductor substrate 25, and the PWELL region 22 is formed over the DEEP-NWELL region 19.

In the PWELL region 22, an N-type semiconductor region 54 and an N-type semiconductor region 55 are formed to serve as a drain and source of the transistor T5, respectively. Over the n-type semiconductor regions 54 and 55, a gate 57 is formed via an oxide film 56.

For the transistor T4, an n-type semiconductor region 59 and an n-type semiconductor region 58 are formed to serve as a drain and source of the transistor T4, respectively. Over the n-type semiconductor regions 58 and 59, a gate 61 is formed via an oxide film 60.

For the transistor T3, the NWELL region 21a is formed over the p-type semiconductor substrate 25. In the NWELL region 21a, a p-type semiconductor region 62 and a p-type semiconductor region 63 are formed to serve as a drain and source of the transistor T3, respectively. Over the p-type semiconductor regions 62 and 63, a gate 65 is formed via an oxide film 64.

Further, for the transistor T7, the NWELL region 23a is formed over the p-type semiconductor substrate 25. In the NWELL region 23a, a p-type semiconductor region 67 and a p-type semiconductor region 66 are formed to serve as a drain and source of the transistor T7, respectively.

Over the p-type semiconductor regions 66 and 67, a gate 69 is formed via an oxide film 68. Still further, the transistors T6 and T7 are formed in the same manner as for the transistors T4 and T5.

In the preferred embodiment 2 arranged as described above, since no DEEP-NWELL region is provided under the sending-side level shift section 13a and the receiving-side level shift section 14b, there arises no possibility of short-circuiting between the power supply VDD and the power supply VDD2, allowing combinational implementation of DVFS and power consumption control by means of power supply VSS cutoff.

Preferred Embodiment 3

Figure 13:
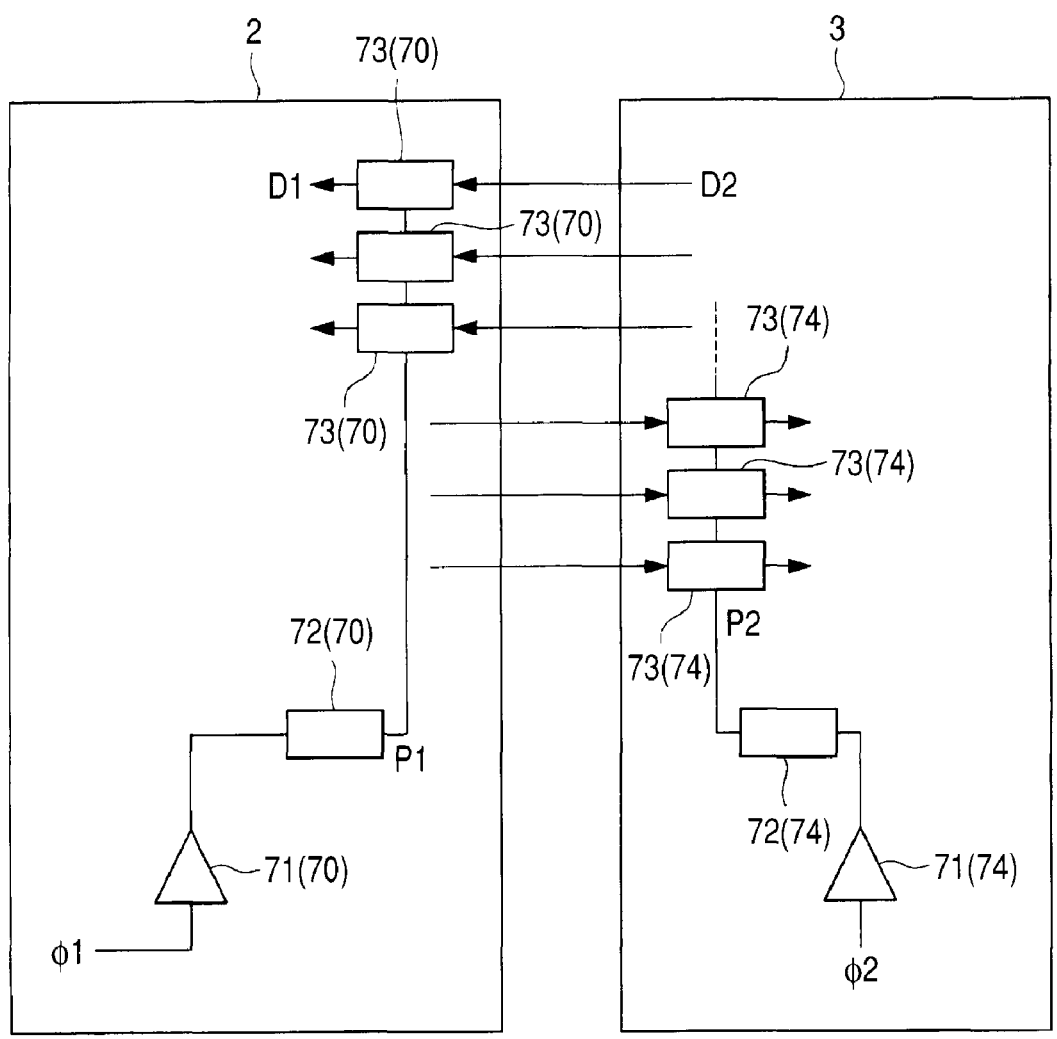
FIG. 13 is an explanatory diagram showing an exemplary pulse-latch-type shifter circuits included in a semiconductor integrated circuit device according to a preferred embodiment 3 of the present invention.
Figure 14:
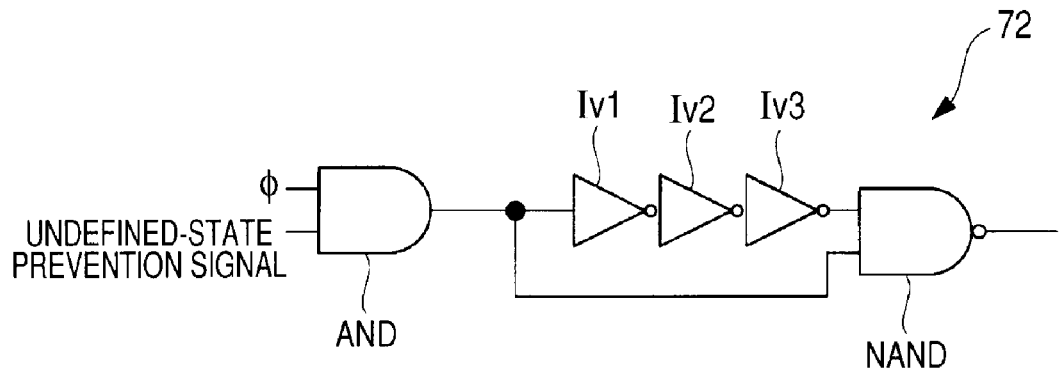
FIG. 14 is a circuit diagram showing an exemplary pulse generating section included in the pulse-latch-type shifter circuit in FIG. 13.
Figure 15:
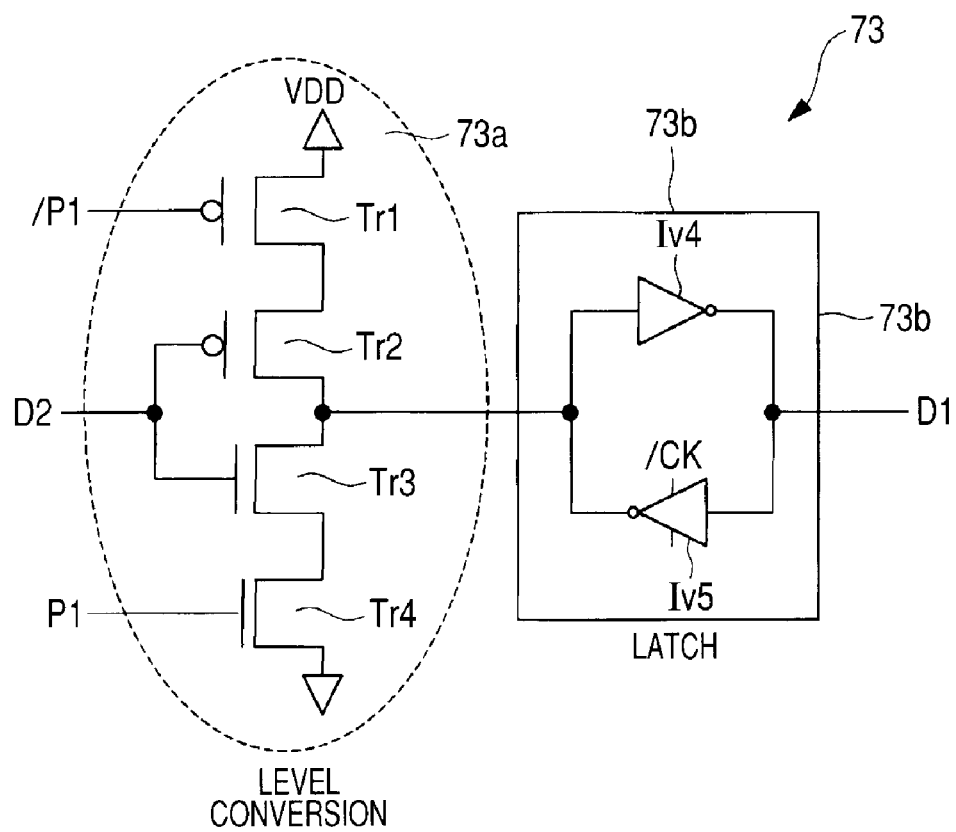
FIG. 15 is a circuit diagram showing an exemplary pulse latch section included in the pulse-latch-type shifter circuit in FIG. 13.
Figure 16:
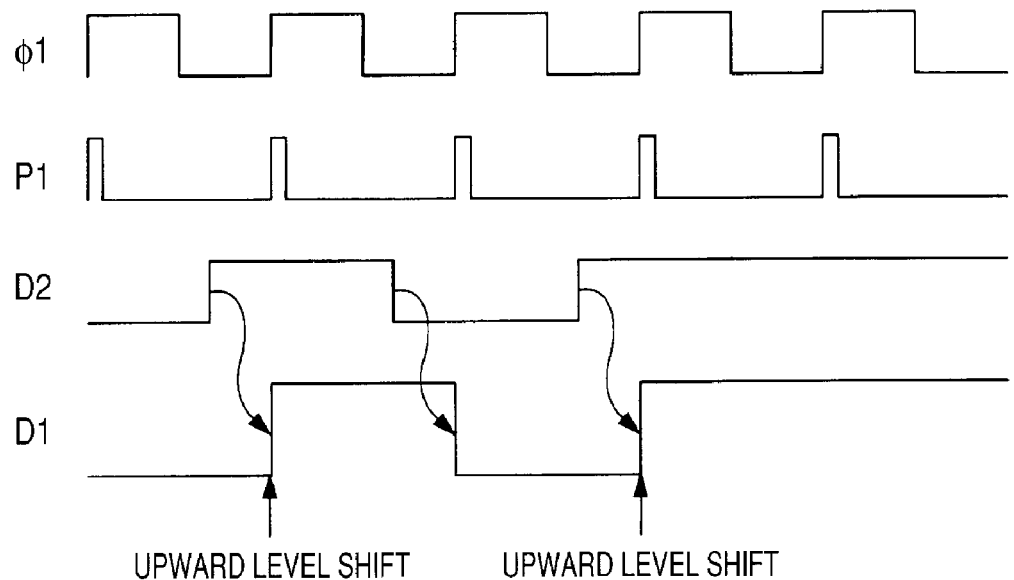
FIG. 16 is a timing chart showing an exemplary operation of the pulse-latch-type shifter circuit in FIG. 13.
Figure 17:
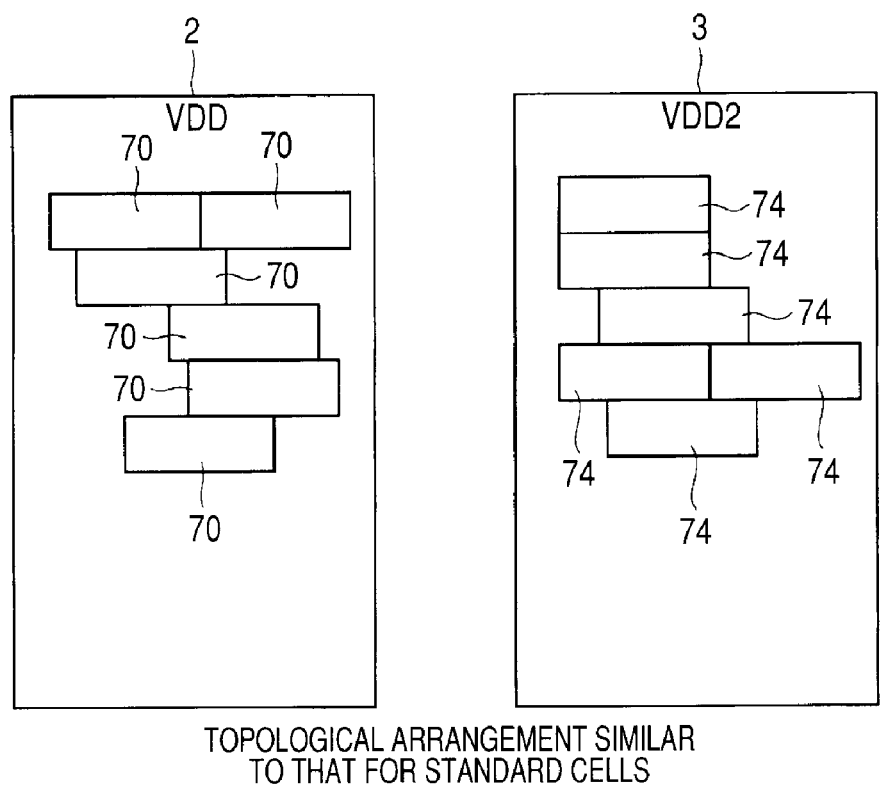
FIG. 17 is an explanatory diagram showing an exemplary layout of the pulse-latch-type shifter circuits in FIG. 13.

FIG. 13 shows an explanatory diagram of an exemplary pulse-latch-type shifter circuits included in a semiconductor integrated circuit device according to a preferred embodiment 3 of the present invention; FIG. 14 is a circuit diagram of an exemplary pulse generating section included in the pulse-latch-type shifter circuit in FIG. 13; FIG. 15 shows a circuit diagram of an exemplary pulse latch section included in the pulse-latch-type shifter circuit in FIG. 13; FIG. 16 shows a timing chart of an exemplary operation of the pulse-latch-type shifter circuit in FIG. 13; and FIG. 17 shows an explanatory diagram of an exemplary layout of the pulse-latch-type shifter circuits in FIG. 13.

According to the preferred embodiment 3 of the present invention, pulse-latch-type shifter circuits 70 and 74 are used as shown in FIG. 13, in lieu of the sending-side level shift section 13a and the receiving-side level shift section 14b exemplified in the preferred embodiments 1 and 2 described above.

The pulse-latch-type shifter circuit 70 is disposed in the circuit block 2, for example. In the pulse-latch-type shifter circuit 70, an amplitude signal of power supply voltage VDD2 is converted into an amplitude signal of power supply voltage VDD, which is then subjected to latching. The pulse-latch-type shifter circuit 74 is disposed in the circuit block 3, for example. In the pulse-latch-type shifter circuit 74, an amplitude signal of power supply voltage VDD is converted into an amplitude signal of power supply voltage VDD2, which is then subjected to latching.

The pulse-latch-type shifter circuit 70 comprises a driver 71, a pulse generating section 72, and a plurality of pulse latch sections 73. The pulse-latch-type shifter circuit 74 is configured similarly to the pulse-latch-type shifter circuit 70.

The pulse latch section 73 allows a level shift operation on the receiving side only. The pulse-latch-type shifter circuit 70 in the circuit block 2 is formed over the DEEP-NWELL region 19. The pulse-latch-type shifter circuit 74 in the circuit block 3 (4) is formed over the DEEP-NWELL region 20.

As shown in FIG. 14, the pulse generating section 72 comprises a logical AND circuit, inverters Iv1 to Iv3, and a logical NAND circuit. One input part of the logical AND circuit is arranged to receive a clock signal 4) output via the driver 71, and the other input part of the logical AND circuit is arranged to receive an undefined-state prevention signal.

The output part of the logical AND circuit is coupled to the inverters IV1 to Iv3 arranged in series. The output part of the inverter Iv3 is coupled to one input part of the NAND circuit, and the other input part of the NAND circuit is coupled to the output part of the logical AND circuit.

In the circuit configuration mentioned above, the output part of the logical AND circuit serves as an output terminal of the pulse generating section 72. A one-shot pulse signal P1 (P2), based on a delay operation by the inverters, is output from the pulse generating section 72.

Further, as shown in FIG. 15, the pulse latch section 73 comprises a level conversion part 73a and a latch part 73b. The level conversion part 73a has a circuit configuration in which p-channel MOS transistors Tr1 and Tr2, and n-channel MOS transistors Tr3 and Tr4 are coupled in series between the power supply VDD and a reference potential. The latch part 73b has a circuit configuration including inverters Iv4 and Iv5.

A gate of each of the transistors Tr2 and Tr3 is arranged to receive an input signal, and a gate of the transistor Tr4 is arranged to receive the one-shot pulse signal P1 output from the pulse generating section 72. A gate of the transistor Tr1 is arranged to receive an inverted one-shot pulse signal /P1, which is an inverted signal of the one-shot pulse signal P1.

In the pulse latch section 73, when a sending-side circuit block is powered off, a clock signal CK goes Low due to an undefined state of input.

Referring to FIG. 16, there is shown a timing chart of the pulse-latch-type shifter circuit 70.

The following signals are indicated in the timing chart of FIG. 16; clock signal φ1, one-shot pulse signal P1 output from the pulse generating section 72, input signal D2 to the pulse latch section 73, and output signal D1 from the pulse latch section 73.

When a High signal is output from the circuit block 3, the one-shot pulse signal P1 output from the pulse generating section 72 and the inverted one-shot pulse signal /P1 thereof are input to the gates of the transistors Tr4 and Tr1, respectively, thereby causing the level conversion part 73a to output a Low signal having a converted voltage level.

The Low signal output from the level conversion part 73a is latched by the latch part 73b, and then the Low signal thus latched is inverted to a High signal, which is then output from the latch part 73b as the D1 signal to be input to the circuit block 2.

When a Low signal is output from the circuit block 3, the level conversion part 73a converts the level of the Low signal to output a High signal having a converted voltage level.

Referring to FIG. 17, there is shown an exemplary layout of the pulse-latch-type shifter circuits 70 and the pulse-latch-type shifter circuits 74. As illustrated in FIG. 17, since each of the pulse-latch-type shifter circuits 70 and 74 is fed with power voltage from a single power supply, there arises no possibility of short-circuiting in the DEEP-NWELL region. It is therefore allowed to arrange circuits in the DEEP-NWELL region with a higher degree of freedom in layout design.

In the preferred embodiment 3, since the pulse-latch-type shifter circuit 70 and the pulse-latch-type shifter circuit 74 are arranged as described above, a level shift operation is allowed by using logical function blocks on the receiving side only, thereby making it possible to prevent a short-circuit between the power supply VDD and the power supply VDD2.

Preferred Embodiment 4

Figure 18:
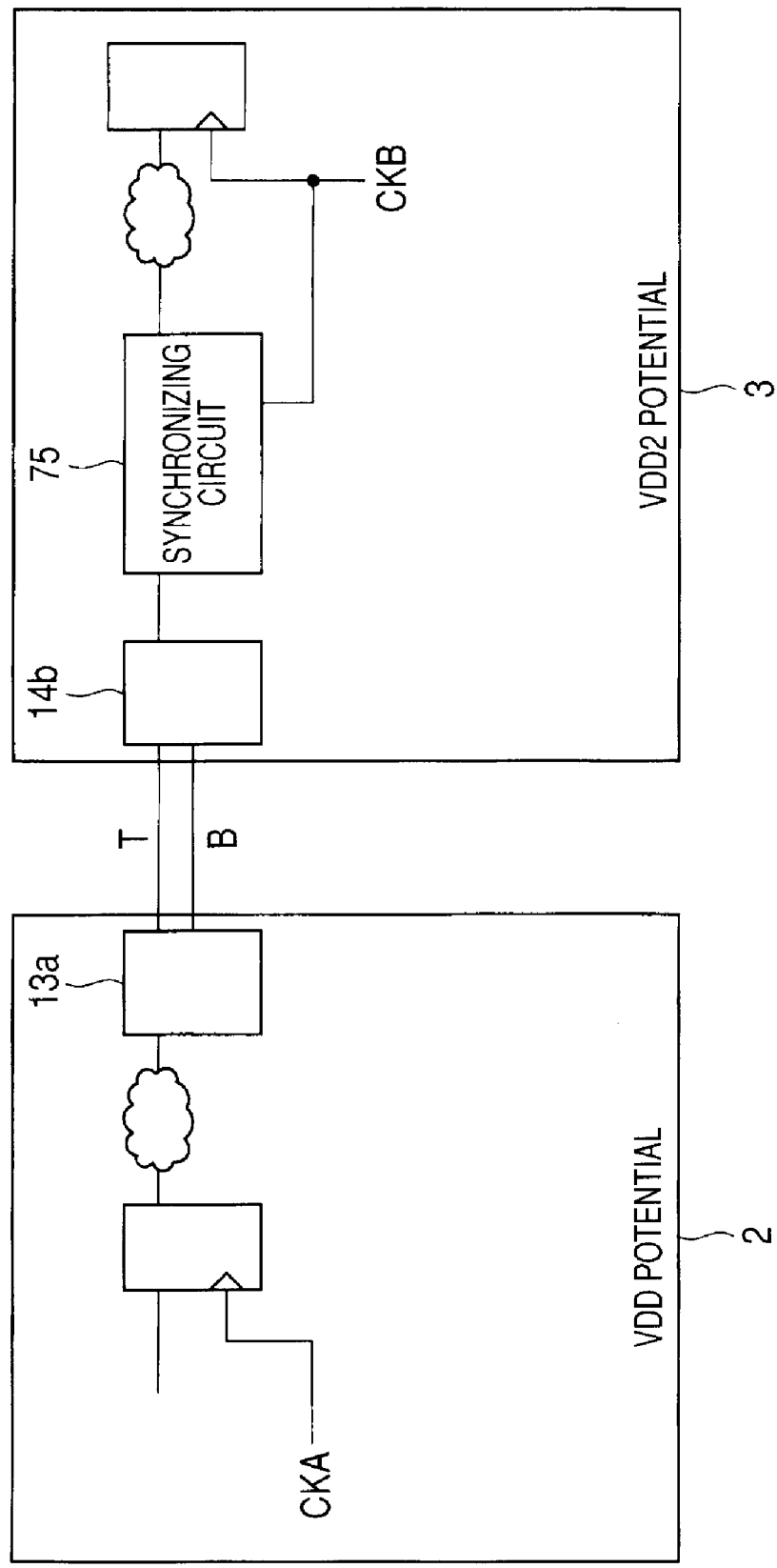
FIG. 18 is an explanatory diagram showing an exemplary circuit arrangement of level shifters and a synchronizing circuit included in a semiconductor integrated circuit device according to a preferred embodiment 4 of the present invention.
Figure 19:
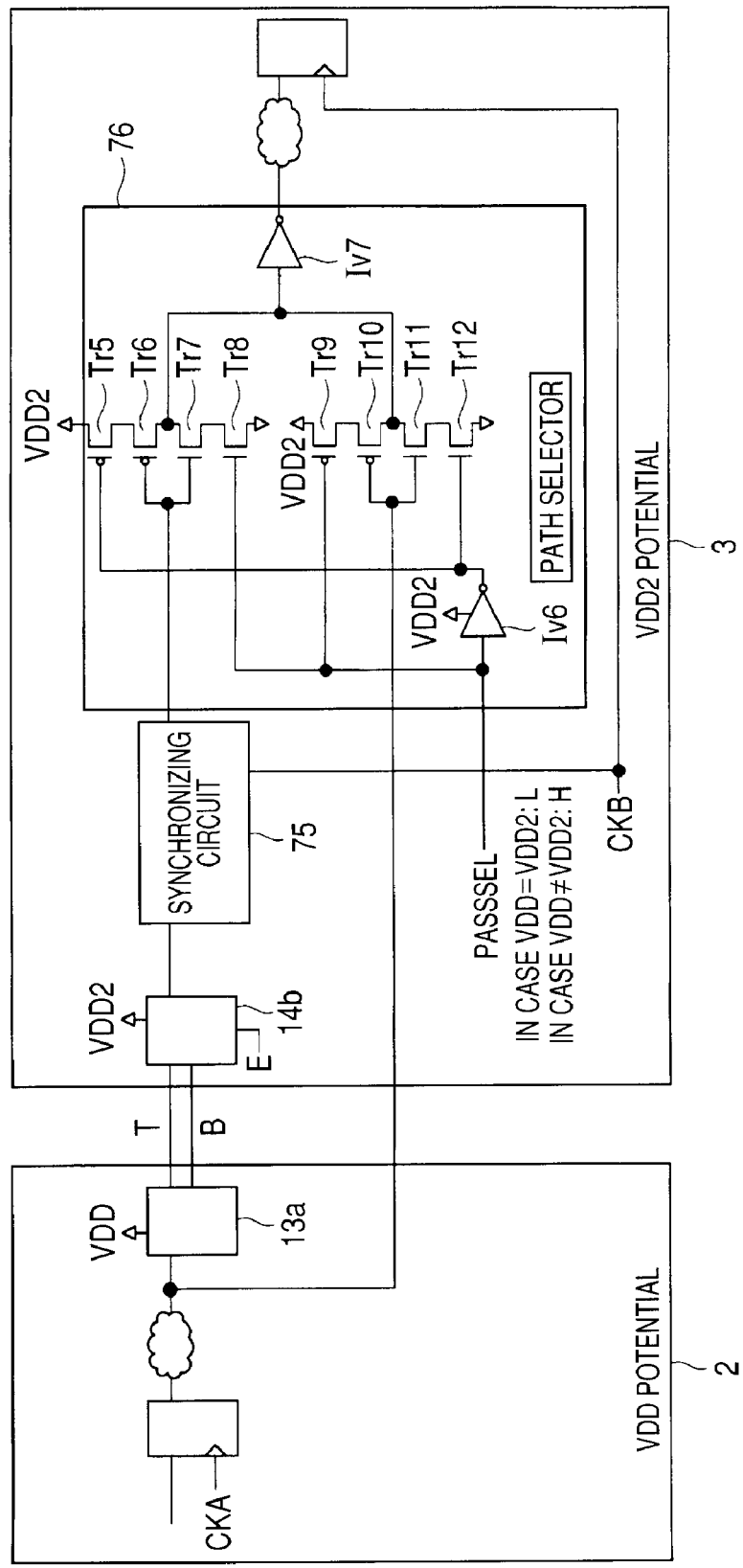
FIG. 19 is a circuit diagram showing an exemplary circuit arrangement in which a path selector is provided at a stage posterior to signal synchronization conducted by the synchronizing circuit in FIG. 18.
Figure 20:
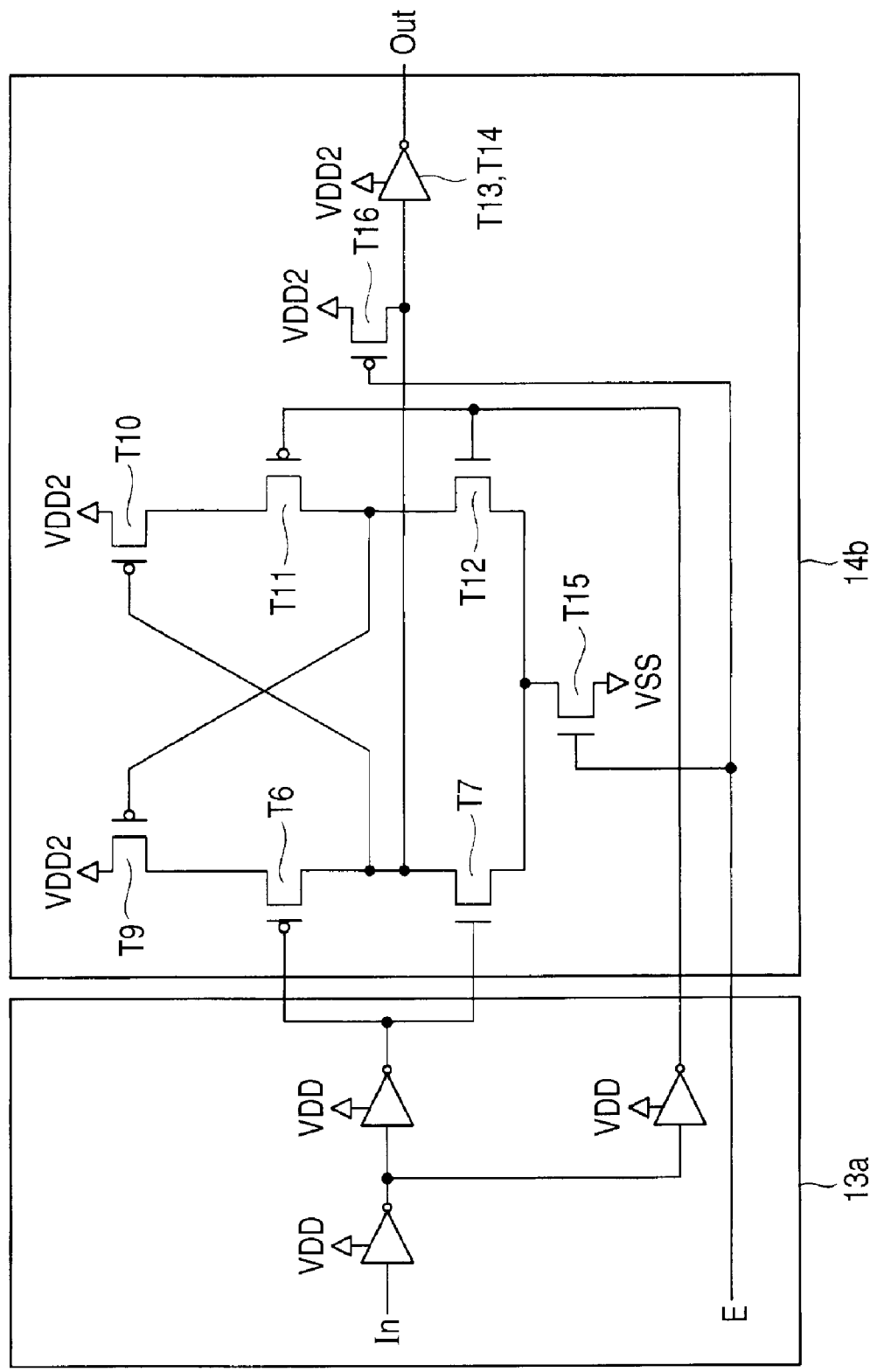
FIG. 20 is a circuit diagram showing an exemplary circuit arrangement of a receiving-side level shift section in FIG. 19.
Figure 21:
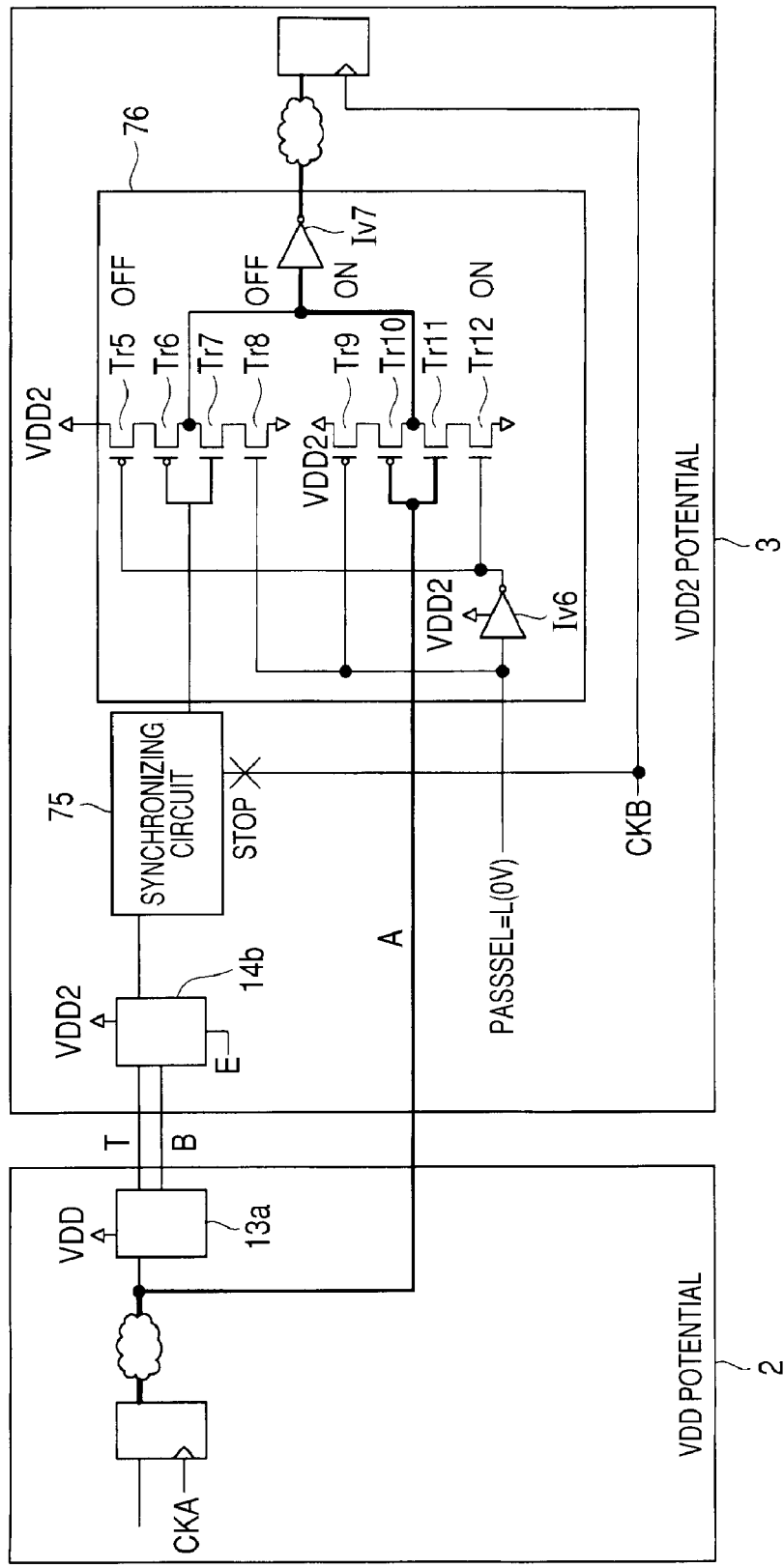
FIG. 21 is an explanatory diagram showing an exemplary operation in the circuit arrangement in FIG. 19.
Figure 22:
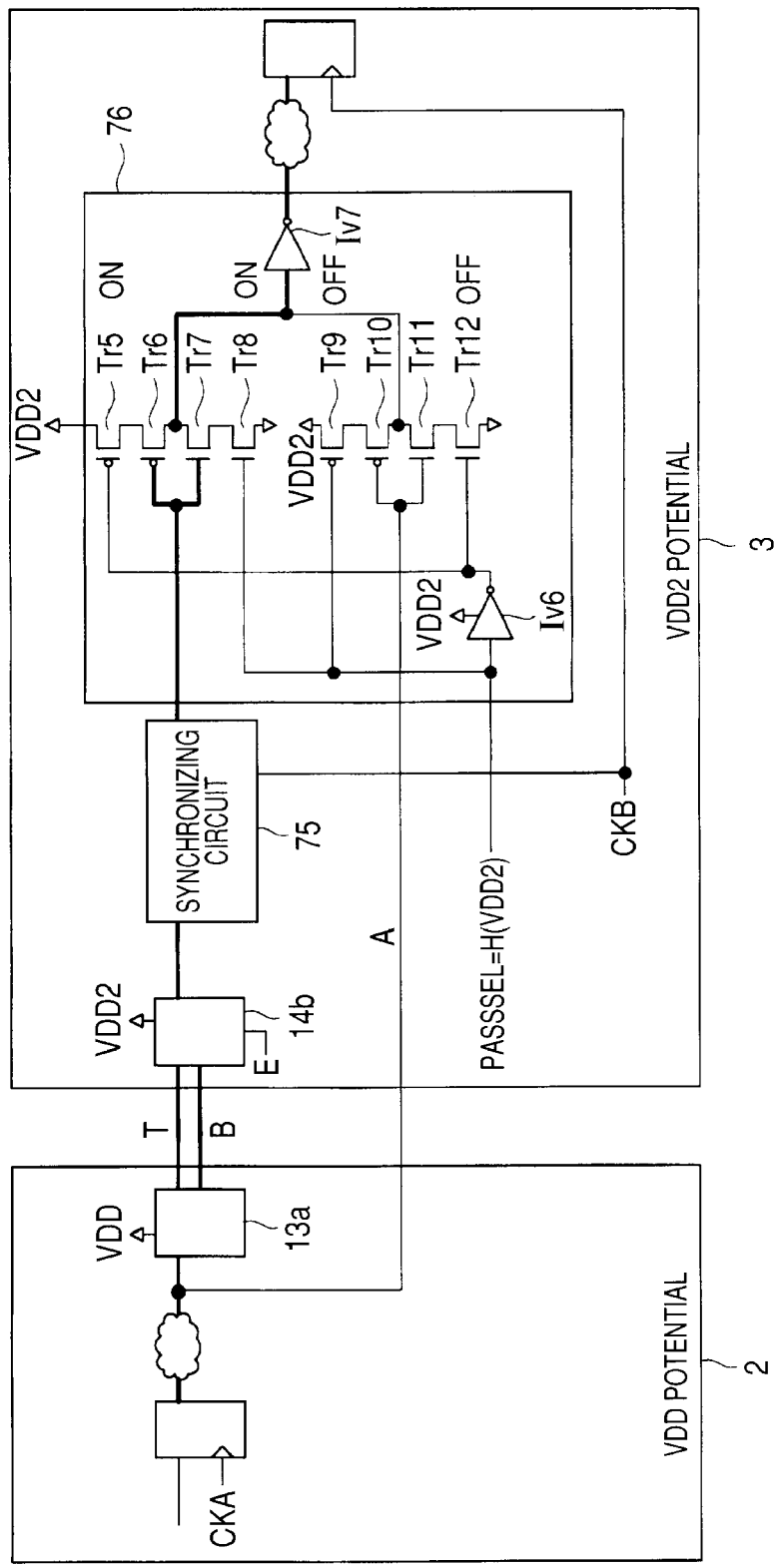
FIG. 22 is an explanatory diagram showing another exemplary operation in the circuit arrangement in FIG. 19.
Figure 23:
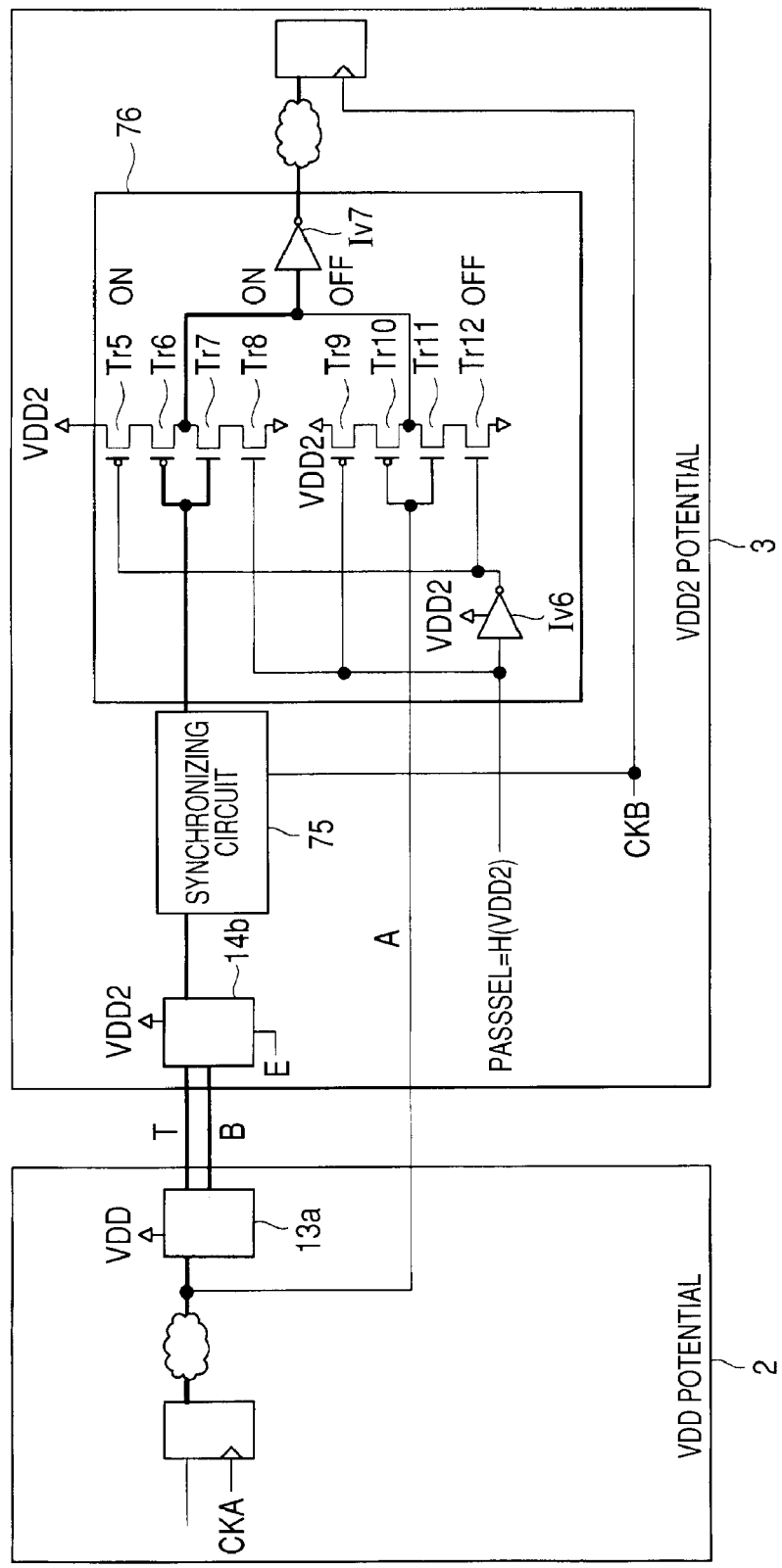
FIG. 23 is an explanatory diagram showing an exemplary operation in the circuit arrangement in FIG. 19 under the condition that a sending-side circuit block is powered off.
Figure 24:
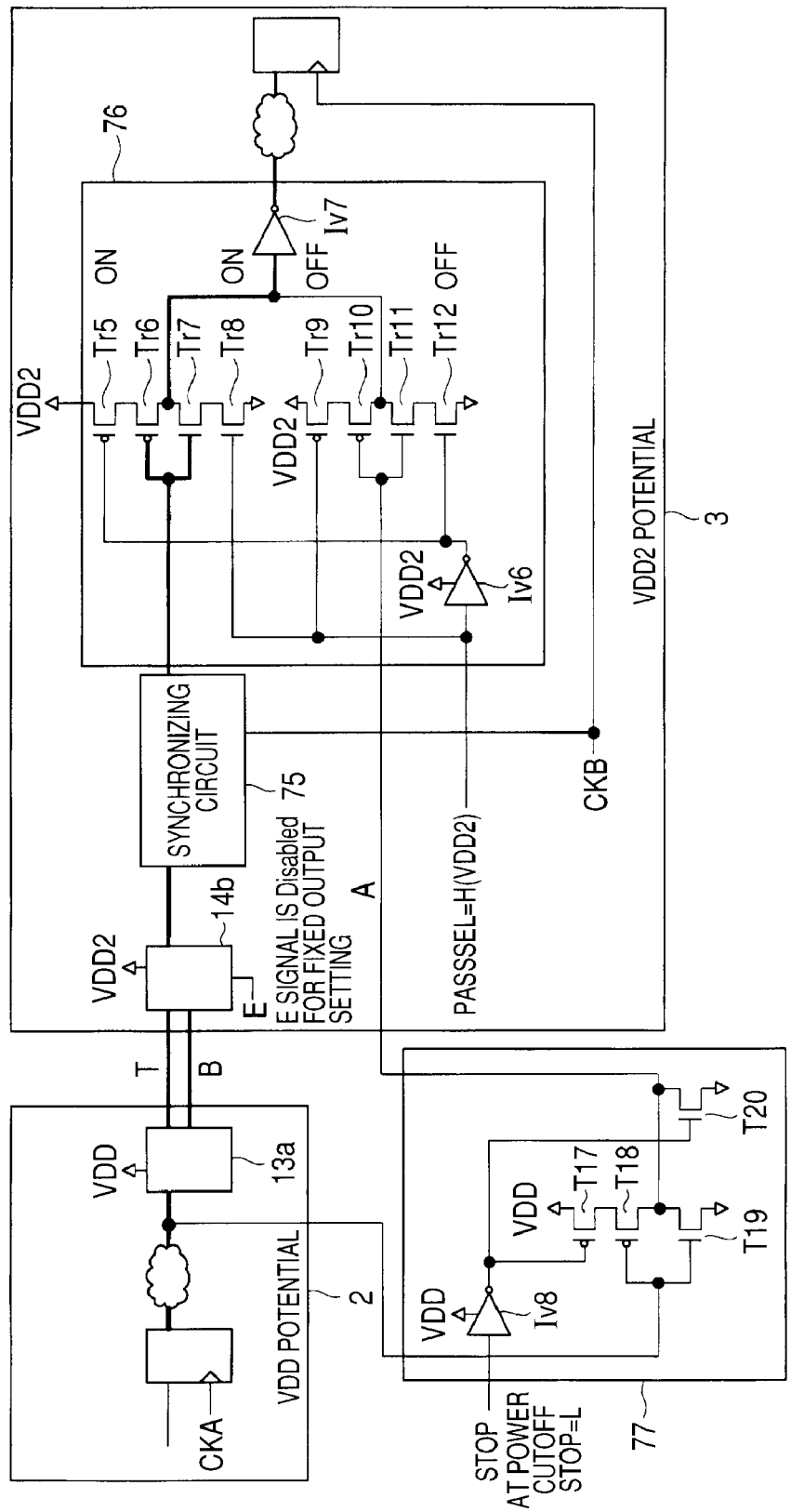
FIG. 24 is a circuit diagram showing another exemplary operation in the receiving-side level shift section in FIG. 19.
Figure 25:
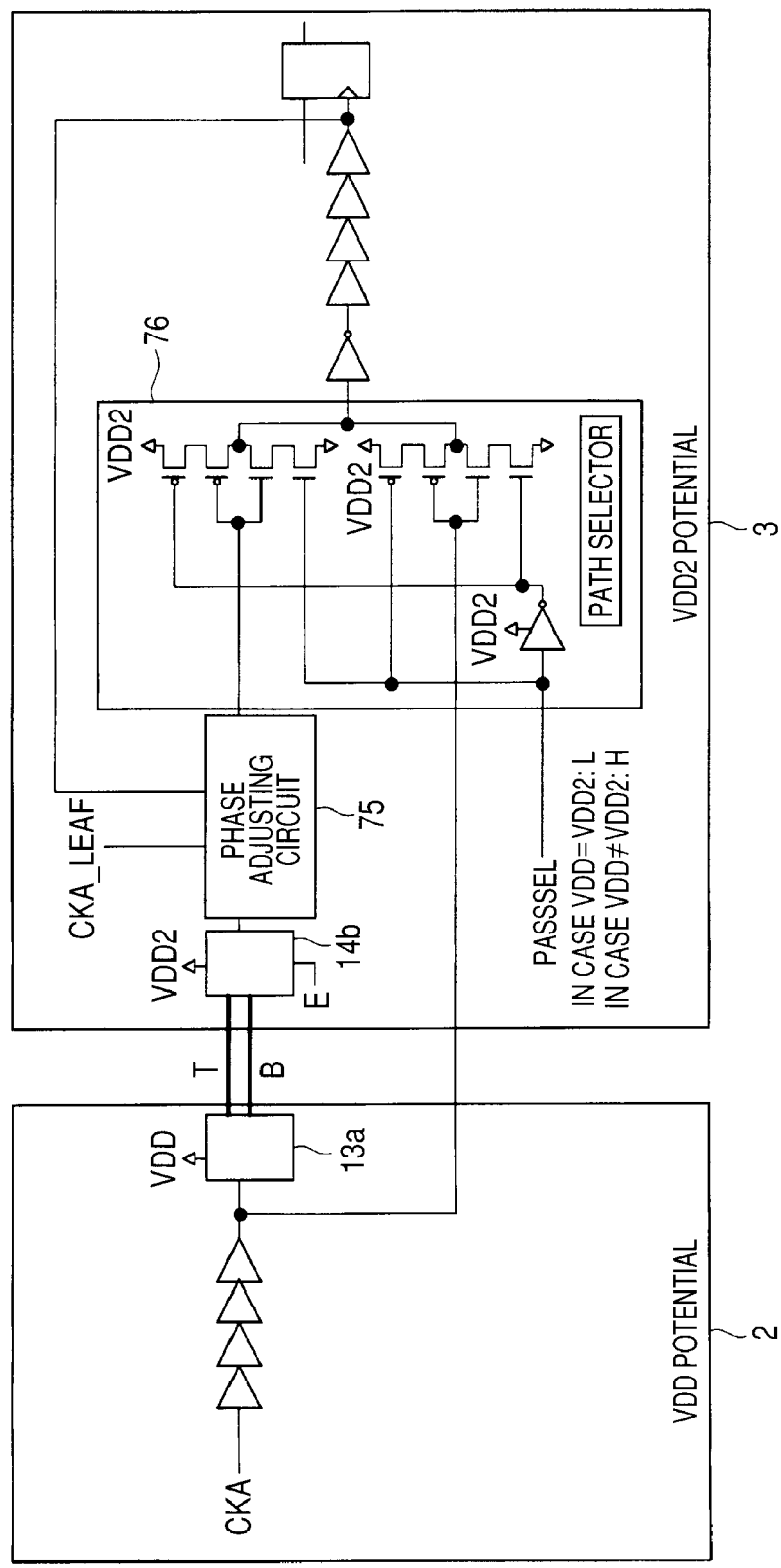
FIG. 25 is an explanatory diagram showing an exemplary circuit arrangement in which the circuit illustrated in FIG. 18 is used as a clock signal line circuit.
Figure 26:
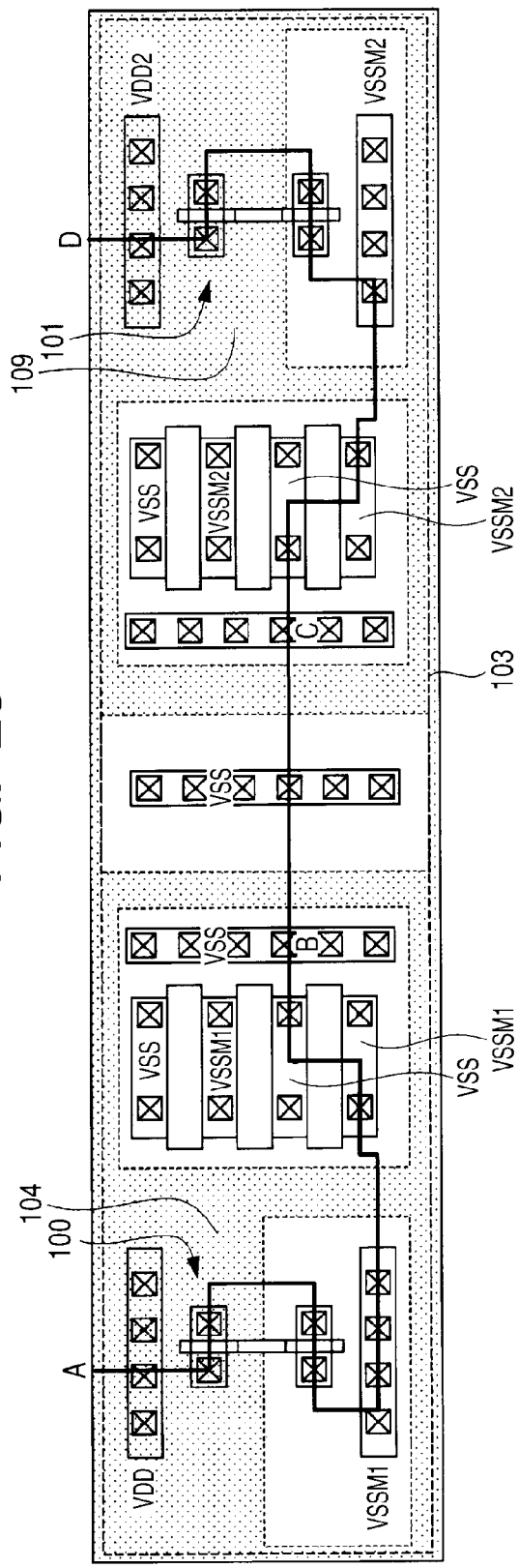
FIG. 26 is an explanatory diagram showing an exemplary layout of transistor formation for a level shifter, wherein a PWELL region is isolated from a p-type semiconductor substrate by a DEEP-NWELL region examined by the present inventors.

FIG. 18 shows an explanatory diagram of an exemplary circuit arrangement of level shifters and a synchronizing circuit included in a semiconductor integrated circuit device according to a preferred embodiment 4 of the present invention; FIG. 19 shows a circuit diagram of an exemplary circuit arrangement in which a path selector is provided at a stage posterior to signal synchronization conducted by the synchronizing circuit in FIG. 18; FIG. 20 shows a circuit diagram of an exemplary circuit arrangement of a receiving-side level shift section in FIG. 19; FIG. 21 shows an explanatory diagram of an exemplary operation in the circuit arrangement in FIG. 19; FIG. 22 shows an explanatory diagram of another exemplary operation in the circuit arrangement in FIG. 19; FIG. 23 shows an explanatory diagram of an exemplary operation in the circuit arrangement in FIG. 19 under the condition that a sending-side circuit block is powered off; FIG. 24 shows a circuit diagram of another exemplary operation in the receiving-side level shift section in FIG. 19; and FIG. 25 shows an exemplary diagram of an exemplary circuit arrangement in which the circuit illustrated in FIG. 18 is used as a clock signal line circuit.

According to the preferred embodiment 4 of the present invention, as shown in FIG. 18, an output signal from the sending-side level shift section 13a is received by the receiving-side level shift section 14b, and then a level-converted signal output from the receiving-side level shift section 14b is synchronized with a clock signal CKB by a synchronizing circuit 75 for signal output operation.

Since the power supply VDD and the power supply VDD2 have different voltage levels, a latency difference may occur in clock signaling. To prevent this, it is required to carry out synchronization by using the synchronizing circuit 75. Over the DEEP-NWELL region 20 (FIG. 3), the synchronizing circuit 75 is formed at a succeeding stage of the receiving-side level shift section 14b.

Referring to FIG. 19, there is shown a circuit diagram of an exemplary circuit arrangement in which a path selector 76 is provided at a stage posterior to signal synchronization conducted by the synchronizing circuit 75 in FIG. 18.

When the voltage levels of the power supply VDD and the power supply VDD2 are equal to each other, the path selector 76 selects a signal path over which an output signal from the circuit block 2 is input to a logical circuit section of the circuit block 3 without conditioning through the sending-side level shift section 13a and the receiving-side level shift section 14b.

The path selector 76 comprises inverters Iv6 and Iv7, and transistors Tr5 to Tr12. The transistors Tr5 to Tr8 are coupled in series between the power supply VDD2 and the power supply VSS.

Likewise, the transistors Tr9 to Tr12 are also coupled in series between the power supply VDD2 and the power supply VSS. The transistors Tr5, Tr6, Tr9, and Tr10 are formed as p-channel MOS elements, and the transistors Tr7, Tr8, Tr11, and Tr12 are formed as n-channel MOS elements.

A select signal PASSSEL output from a voltage setting register or the like is applied to an input part of the inverter Iv6 and a gate of each of the transistors Tr8 and Tr9.

An output part of the synchronizing circuit 75 is coupled to a gate of each of the transistors Tr6 and Tr7, and an output part of the inverter Iv6 is coupled to a gate of each of the transistors Tr5 and Tr12.

Further, a gate of each of the transistors Tr10 and Tr11 is arranged to receive the signal output from the circuit block 2. A power electrode part common to the transistors Tr6 and Tr7 and a power electrode part common to the transistors Tr10 and Tr11 are coupled to an input part of the inverter Iv7. An output part of the inverter Iv7, which serves as an output terminal of the path selector 76, is coupled to the logical circuit section of the circuit block 3.

Referring to FIG. 20, there is shown a circuit diagram of an exemplary circuit arrangement of the receiving-side level shift section 14b in FIG. 19.

As shown in FIG. 20, the receiving-side level shift section 14b is provided with an output-enable terminal E for receiving an output-enable signal delivered from the PMU 5, for example. The receiving-side level shift section 14b is provided with transistors T15 and T16, which are additional transistors further included in the circuit arrangement of FIG. 10 according to the preferred embodiment 2.

The transistor T15 is formed as an n-channel MOS element, and the transistor T16 is formed as a p-channel MOS element. One power electrode part of the transistor T15 is coupled to a power electrode part common to the transistors T7 and T12, and the other power electrode part of the transistor T15 is coupled to the power supply VSS.

One power electrode part of the transistor T16 is coupled to the power supply VDD2, and the other power electrode part of the transistor T16 is coupled to a power electrode part common to the transistors T6 and T7.

Further, a gate of the transistor T15 and a gate of the transistor T16 are arranged to receive the output-enable signal. When a Low level signal is input to the output-enable terminal E, an output from the receiving-side level shift section 14b is fixedly set to a Low level, i.e., the receiving-side level shift section 14b is put in a disabled state. Since the other coupling arrangements are similar to those shown in FIG. 10, no repetitive description thereof is given here.

When the voltage levels of the power supply VDD and the power supply VDD2 are equal to each other, the select signal PASSSEL output from the voltage setting register or the like is set to a Low state. In this case, as shown in FIG. 21, the transistors Tr9 and Tr12 turn on to cause the circuit block 2 to output a node-A signal via the transistors Tr9 to Tr12 and the inverter Iv7 thereof.

In the above-mentioned operation, the Low level signal is input to the output-enable terminal E of the receiving-side level shift section 14b so that an output from the receiving-side level shift section 14b is fixedly set to a Low level. Since the voltage levels of the power supply VDD and the power supply VDD2 are equal to each other, the maximum amplitude level of the node-A signal (gate voltage at the transistors Tr10 and Tr11) becomes equal to the voltage level of the power supply VDD2. Hence, even when the transistors 9 and Tr12 are put into conduction, the transistors Tr10 and Tr11 arranged to form an inverter are not switched into conduction at the same time, thereby preventing a through-current from flowing through a line of the transistors Tr9 to Tr12.

Further, when the voltage levels of the power supply VDD and the power supply VDD2 are equal to each other, it is not required to perform signal synchronization. Therefore, a clock signal input to the synchronizing circuit 75 is stopped.

Contrastingly, when the voltage levels of the power supply VDD and the power supply VDD2 are different from each other, the select signal PASSSEL is set to a High state. Thus, as shown in FIG. 22, the transistors Tr5 and Tr8 turn on to allow a signal output from the circuit block 2.

That is, a signal is output through the sending-side level shift section 13a, the receiving-side level shift section 14b, the synchronizing circuit 75, the transistors Tr5 to Tr8, and the inverter Iv7.

In this case, since the transistors Tr9 and Tr12 turn off, a through-current does not flow even if "node A" shown in FIG. 22 provides an amplitude level of power supply voltage VDD.

Referring to FIG. 23, there is shown an explanatory diagram of an exemplary operation under the condition that the sending-side circuit block 2 is powered off.

When the sending-side circuit block 2 is powered off, there occurs a condition that signals on the True and Bar wiring lines of the sending-side level shift section 13a and a signal at node A in FIG. 23 are undefined.

In this case, the Low level signal is input to the output-enable terminal E, and the select signal PASSSEL is set to a High state. Thus, a Low signal state is fixedly set up in the receiving-side level shift section 14b, causing the transistors Tr9 and Tr12 to turn off. Hence, a through-current does not flow even if "node A" provides an amplitude level of power supply voltage VDD.

Further, while undefined potential processing is performed by the path selector 76 disposed in the receiving-side circuit block 3 in the exemplary operation shown in FIG. 23, there may be provided a modified arrangement in which an undefined potential processing circuit 77 is disposed in the circuit block 18 serving as an always-on region as shown in FIG. 24, for example.

The undefined potential processing circuit 77 comprises an inverter Iv8 and transistors T17 to T20 as illustrated in FIG. 24. The transistors T17 and T18 are formed as p-channel MOS elements, and the transistors T19 and T20 are formed as re-channel MOS elements.

An input part of the inverter Iv8 is arranged to receive a power-off signal STOP to be output from the PMU 5 when the circuit block 2 is powered off. An output part of the inverter Iv8 is coupled to a gate of each of the transistors T17 and T20.

The transistors T17 to T19 are coupled in series between the power supply VDD and the power supply VSS. One power electrode part of the transistor T20 is coupled to a power electrode part common to the transistors T18 and T19, and the other electrode part of the transistor T20 is coupled to the power supply VSS.

Further, the power electrode part common to the transistors T18 and T19 is coupled to a gate of each of the transistors Tr10 and Tr11.

When the circuit block 2 is powered off, the power-off signal STOP having a Low level is input to the undefined potential processing circuit 77. Thus, the undefined potential processing circuit 77 outputs a Low-level-fixed signal to turn off the transistors Tr9 and Tr12, thereby preventing a through-current from flowing through a line of the transistors Tr9 to Tr12.

Furthermore, the present invention is applicable not only to a signal line but also to a clock line for a clock signal CKA such as shown in FIG. 25, for example.

The circuit arrangement exemplified in FIG. 25 is similar to that shown in FIG. 19 except that the clock signal CKA is sent and received. Operations in FIG. 25 are also similar to those in FIG. 19. When the voltage levels of the power supply VDD and the power supply VDD2 are equal to each other, it is not required to perform a voltage level conversion operation. Hence, the select signal PASSSEL is set to a Low state to select a path not including the sending-side level shift section 13a and the receiving-side level shift section 14b.

When the voltage levels of the power supply VDD and the power supply VDD2 are different from each other, the select signal PASSSEL is set to a High state to select a path including the sending-side level shift section 13a and the receiving-side level shift section 14b.

Thus, a latency increase can be prevented in clock signaling to be performed through the sending-side level shift section 13a, the receiving-side level shift section 14b, and the synchronizing circuit 75.

According to the preferred embodiment 4, since a delay time in signal transmission/reception can be reduced, it is possible to enhance the reliability of the semiconductor integrated circuit device 1.

While the present invention has been described in detail with respect to specific embodiments thereof, it is to be understood that the present invention is not limited by any of the details of description and that various changes and modifications may be made in the present invention without departing from the spirit and scope thereof.

What is claimed is:

1. A semiconductor integrated circuit device comprising:
   a first circuit block to be put under a first low-power-consumption control operation;
   a second circuit block to be put under the first low-power-consumption control operation and a second low-power-consumption control operation;
   a power supply switch control section for outputting control signals when each low-power-consumption control operation is judged to be allowed in the first and second circuit blocks;
   a first power supply switch section for performing the first low-power-consumption control operation by cutting off a reference potential fed to the first circuit block in accordance with a control signal output from the power supply switch control section;
   a second power supply switch section for performing the second low-power-consumption control operation by cutting off a reference potential fed to the second circuit block in accordance with a control signal output from the power supply switch control section; and
   a frequency/power supply control section for performing the second low-power-consumption control operation by dynamically varying an operating frequency and a core voltage fed to the second circuit block;
   wherein the first circuit block includes a first sending-side level shifter and a first receiving-side level shifter, and the second circuit block includes a second-sending-side level shifter and a second receiving-side level shifter,
   wherein the first sending-side level shifter sends an output signal from the first circuit block,
   wherein the first receiving-side level shifter receives a signal sent from the second sending-side level shifter, providing the first circuit block with a signal converted to a voltage level of a power supply amplitude used for the first circuit block,
   wherein the second sending-side level shifter sends an output signal from the second circuit block, and the second receiving-side level shifter receives a signal sent from the first sending-side level shifter, converts the thus received signal into a signal having a voltage level of a power supply amplitude used for the second circuit block, and provides the thus converted signal to the second circuit block,
   wherein the first circuit block, the first power supply switch section and the first sending-side level shifter are formed in a first WELL isolation region formed over a semiconductor substrate, and
   wherein the first receiving-side level shifter, the second circuit block, the second power supply switch section, the second sending-side level shifter, and the second receiving-side level shifter are formed in a second WELL isolation region formed over the semiconductor substrate separately from the first WELL isolation region.

2. The semiconductor integrated circuit device according to claim 1,
wherein each of the first and second circuit blocks arranged to receive signals comprises a synchronizing circuit coupled to each of the first and second receiving-side level shifters respectively, and
wherein signals output from the first and second receiving-side level shifter are synchronized with an arbitrary clock signal by using the synchronizing circuit.

3. The semiconductor integrated circuit device according to claim 2,
wherein each of the first and second circuit blocks arranged to receive signals comprises a path selector,
wherein, when the operating voltage levels of the first and second circuit blocks are equal to each other, the path selector selects a path in accordance with a select signal output from the frequency/power supply control section so that an output signal from the first or second circuit block is input to the second or first circuit block respectively without through the first sending-side level shifter, the second sending-side level shifter, the first receiving-side level shifter, and the second receiving-side level shifter, and
wherein, when the operating voltage levels of the first and second circuit blocks are different from each other, the path selector selects a path in accordance with a select signal output from the frequency/power supply control section so that an output signal from the first circuit block is input to the second circuit block through the first sending-side level shifter and the first receiving-side level shifter, and so that an output signal from the second circuit block is input to the first circuit block through the second sending-side level shifter and the second receiving-side level shifter.

4. The semiconductor integrated circuit device according to claim 1,
wherein the first sending-side level shifter outputs a signal from the first circuit block as a differential signal, and the second sending-side level shifter outputs a signal from the second circuit block as a differential signal,
wherein, upon receipt of the differential signal, the first receiving-side level shifter converts the received differential signal into a signal having a voltage level of a power supply amplitude used for the second circuit block, and outputs the thus converted signal,
wherein, upon receipt of the differential signal, the second receiving-side level shifter converts the received differential signal into a signal having a voltage level of a power supply amplitude used for the first circuit block, and outputs the thus converted signal, and
wherein a differential signal wiring line for coupling the first sending-side level shifter and the first receiving-side level shifter and a differential wiring line for coupling the second sending-side level shifter and the second receiving-side level shifter are arranged respectively to sandwich therebetween at least either one of a power supply voltage wiring line and a reference potential wiring line.

5. A semiconductor integrated circuit device comprising:
a first circuit block to be put under a first low-power-consumption control operation;
a second circuit block to be put under the first low-power-consumption control operation and a second low-power-consumption control operation;
a power supply switch control section for outputting control signals when each low-power-consumption control operation is judged to be allowed in the first and second circuit blocks;
a first power supply switch section for performing the first low-power-consumption control operation by cutting off a power supply voltage fed to the first circuit block in accordance with a control signal output from the power supply switch control section;
a second power supply switch section for performing the second low-power-consumption control operation by cutting off a power supply voltage fed to the second circuit block in accordance with a control signal output from the power supply switch control section; and
a frequency/power supply control section for performing the second low-power-consumption control operation by dynamically varying an operating frequency and a core voltage fed to the second circuit block;
wherein the first circuit block includes a first sending-side level shifter and a first receiving-side level shifter, and the second circuit block includes a second-sending-side level shifter and a second receiving-side level shifter,
wherein the first sending-side level shifter sends an output signal from the first circuit block,
wherein the first receiving-side level shifter receives a signal sent from the second sending-side level shifter, providing the first circuit block with a signal converted to a voltage level of a power supply amplitude used for the first circuit block,
wherein the second sending-side level shifter sends an output signal from the second circuit block, and the second receiving-side level shifter receives a signal sent from the first sending-side level shifter, converts the thus received signal into a signal having a voltage level of a power supply amplitude used for the second circuit block, and provides the thus converted signal to the second circuit block,
wherein the first circuit block, the first power supply switch section, and the first sending-side level shifter are formed in a first WELL isolation region formed over a semiconductor substrate, and
wherein the first receiving-side level shifter, the second circuit block, the second power supply switch section, the second sending-side level shifter, and the second receiving-side level shifter are formed in a second WELL isolation region formed over the semiconductor substrate separately from the first WELL isolation region.

6. The semiconductor integrated circuit device according to claim 5,
wherein each of the first and second circuit blocks arranged to receive signals comprises a synchronizing circuit coupled to each of the first and second receiving-side level shifters respectively, and
wherein signals output from the first and second receiving-side level shifter are synchronized with an arbitrary clock signal by using the synchronizing circuit.

7. The semiconductor integrated circuit device according to claim 6,
wherein each of the first and second circuit blocks arranged to receive signals comprises a path selector,
wherein, when the operating voltage levels of the first and second circuit blocks are equal to each other, the path selector selects a path in accordance with a select signal output from the frequency/power supply control section so that an output signal from the first or second circuit block is input to the second or first circuit block respectively without through the first sending-side level shifter, the second sending-side level shifter, the first receiving-side level shifter, and the second receiving-side level shifter, and wherein, when the operating voltage levels of the first and second circuit blocks are different from each other, the path selector selects a path in accordance with a select signal output from the frequency/power supply control section so that an output signal from the first circuit block is input to the second circuit block through the first sending-side level shifter and the first receiving-side level shifter, and so that an output signal from the second circuit block is input to the first circuit block through the second sending-side level shifter and the second receiving-side level shifter.

8. The semiconductor integrated circuit device according to claim 5, wherein the first sending-side level shifter outputs a signal from the first circuit block as a differential signal, and the second sending-side level shifter outputs a signal from the second circuit block as a differential signal, wherein, upon receipt of the differential signal, the first receiving-side level shifter converts the received differential signal into a signal having a voltage level of a power supply amplitude used for the second circuit block, and outputs the thus converted signal, wherein, upon receipt of the differential signal, the second receiving-side level shifter converts the received differential signal into a signal having a voltage level of a power supply amplitude used for the first circuit block, and outputs the thus converted signal, and wherein a differential signal wiring line for coupling the first sending-side level shifter and the first receiving-side level shifter and a differential wiring line for coupling the second sending-side level shifter and the second receiving-side level shifter are arranged respectively to sandwich therebetween at least either one of a power supply voltage wiring line and a reference potential wiring line.

9. A semiconductor integrated circuit device comprising:
a first circuit block to be put under a first low-power-consumption control operation;
a second circuit block to be put under the first low-power-consumption control operation and a second low-power-consumption control operation;
a power supply switch control section for outputting control signals when each low-power-consumption control operation is judged to be allowed in the first and second circuit blocks;
a first power supply switch section for performing the first low-power-consumption control operation by cutting off a power supply voltage fed to the first circuit block in accordance with a control signal output from the power supply switch control section;
a second power supply switch section for performing the second low-power-consumption control operation by cutting off a power supply voltage fed to the second circuit block in accordance with a control signal output from the power supply switch control section; and
a frequency/power supply control section for performing the second low-power-consumption control operation by dynamically varying an operating frequency and a core voltage fed to the second circuit block;
wherein the first receiving-side level shifter receives a signal sent from the second sending-side level shifter, providing the first circuit block with a signal converted to a voltage level of a power supply amplitude used for the first circuit block, wherein the second sending-side level shifter sends an output signal from the second circuit block, and the second receiving-side level shifter receives a signal sent from the first sending-side level shifter, converts the thus received signal into a signal having a voltage level of a power supply amplitude used for the second circuit block, and provides the thus converted signal to the second circuit block, wherein the first circuit block and the first power supply switch section are formed in a first WELL isolation region formed over a semiconductor substrate, wherein the second circuit block and the second power supply switch section are formed in a second WELL isolation region formed over the semiconductor substrate separately from the first WELL isolation region, and wherein the first receiving-side level shifter, the first sending-side level shifter, the second receiving-side level shifer, and the second sending-side level shifter are formed in respective semiconductor regions other than the first and second WELL isolation regions formed over the semiconductor substrate.

10. The semiconductor integrated circuit device according to claim 9, wherein the first receiving-side level shifter, the first sending-side level shifter, the second receiving-side level shifter, and the second sending-side level shifter are formed over the semiconductor substrate.

11. A semiconductor integrated circuit device comprising:
a first circuit block to be put under a first low-power-consumption control operation;
a second circuit block to be put under the first low-power-consumption control operation and a second low-power-consumption control operation;
a power supply switch control section for outputting control signals when each low-power-consumption control operation is judged to be allowed in the first and second circuit blocks;
a first power supply switch section for performing the first low-power-consumption control operation by cutting off a reference potential fed to the first circuit block in accordance with a control signal output from the power supply switch control section;
a second power supply switch section for performing the second low-power-consumption control operation by cutting off a reference potential fed to the second circuit block in accordance with a control signal output from the power supply switch control section;
a frequency/power supply control section for performing the second low-power-consumption control operation by dynamically varying an operating frequency and a core voltage fed to the second circuit block;
a first pulse-latch-type shifter circuit disposed in the second circuit block arranged for receiving signals, the first pulse-latch-type shifter circuit being configured to convert an output signal from the first circuit block into a signal having a voltage level of a power supply amplitude used for the second circuit block; and
a second pulse-latch-type shifter circuit disposed in the first circuit block arranged for receiving signals, the second pulse-latch-type shifter circuit being configured to convert an output signal from the second circuit block into a signal having a voltage level of a power supply amplitude used for the first circuit block;

wherein the first power supply switch section and the second power supply switch section are formed in respective different WELL isolation regions formed over a semiconductor substrate.

12. A semiconductor integrated circuit device comprising:
a first circuit block to be put under a first low-power-consumption control operation;
a second circuit block to be put under the first low-power-consumption control operation and a second low-power-consumption control operation;
a power supply switch control section for outputting control signals when each low-power-consumption control operation is judged to be allowed in the first and second circuit blocks;
a first power supply switch section for performing the first low-power-consumption control operation by cutting off a power supply voltage fed to the first circuit block in accordance with a control signal output from the power supply switch control section;
a second power supply switch section for performing the second low-power-consumption control operation by cutting off a power supply voltage fed to the second circuit block in accordance with a control signal output from the power supply switch control section;
a frequency/power supply control section for performing the second low-power-consumption control operation by dynamically varying an operating frequency and a core voltage fed to the second circuit block;
a first pulse-latch-type shifter circuit disposed in the second circuit block arranged for receiving signals, the first pulse-latch-type shifter circuit being configured to convert an output signal from the first circuit block into a signal having a voltage level of a power supply amplitude used for the second circuit block; and
a second pulse-latch-type shifter circuit disposed in the first circuit block arranged for receiving signals, the second pulse-latch-type shifter circuit being configured to convert an output signal from the second circuit block into a signal having a voltage level of a power supply amplitude used for the first circuit block;

13. A semiconductor integrated circuit device comprising:
a first circuit block to be put under a first low-power-consumption control operation;
a second circuit block to be put under the first low-power-consumption control operation and a second low-power-consumption control operation;
a power supply switch control section for outputting control signals when each low-power-consumption control operation is judged to be allowed in the first and second circuit blocks;
a first power supply switch section for performing the first low-power-consumption control operation by cutting off a reference potential fed to the first circuit block in accordance with a control signal output from the power supply switch control section;
a second power supply switch section for performing the second low-power-consumption control operation by cutting off a reference potential fed to the second circuit block in accordance with a control signal output from the power supply switch control section; and
a frequency/power supply control section for performing the second low-power-consumption control operation by dynamically varying an operating frequency and a core voltage fed to the second circuit block;
wherein the first sending-side level shifter sends an output signal from the second circuit block;
wherein a first receiving-side level shifter receives a signal sent from a second sending-side level shifter, providing the first circuit block with a signal converted to a voltage level of a power supply amplitude used for the first circuit block,
wherein the second sending-side level shifter sends an output signal from the second circuit block, and a second receiving-side level shifter receives a signal sent from the first sending-side level shifter, converts the thus received signal into a signal having a voltage level of a power supply amplitude used for the second circuit block, and provides the thus converted signal to the second circuit block,
wherein the first circuit block and the first power supply switch section are formed in a first WELL isloation region formed over a semiconductor substrate,
wherein the second circuit block and the second power supply switch section are formed in a second WELL isolation region formed over the semiconductor substrate separately from the first WELL isolation region, and
wherein the first receiving-side level shifter, the first sending-side level shifter, the second receiving-side level shifter, and the second sending-side level shifter are formed in respective semiconductor regions other than the first and second WELL isolation regions formed over the semiconductor substrate.

14. The semiconductor integrated circuit device according to claim 13,
wherein the first receiving-side level shifter, the first sending-side level shifter, the second receiving-side level shifter, and the second sending-side level shifter are formed over the semiconductor substrate.

* * * * *